(12) United States Patent
Kang et al.

(10) Patent No.: US 11,569,336 B2
(45) Date of Patent: Jan. 31, 2023

(54) DISPLAY APPARATUS

(71) Applicant: Samsung Display Co., Ltd., Yongin-si (KR)

(72) Inventors: Euijeong Kang, Yongin-si (KR); Seungsoo Ryu, Yongin-si (KR); Sijoon Song, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 173 days.

(21) Appl. No.: 17/172,691

(22) Filed: Feb. 10, 2021

(65) Prior Publication Data

US 2022/0028952 A1  Jan. 27, 2022

(30) Foreign Application Priority Data

Jul. 24, 2020 (KR) .................. 10-2020-0092550

(51) Int. Cl.
*H01L 27/32* (2006.01)

(52) U.S. Cl.
CPC ...... *H01L 27/3276* (2013.01); *H01L 27/3223* (2013.01)

(58) Field of Classification Search
CPC ... H01L 27/3276; H01L 27/3223; H05K 1/11; H05K 1/111; H05K 1/118; H05K 1/189
See application file for complete search history.

(56) References Cited

U.S. PATENT DOCUMENTS

| | | | |
|---|---|---|---|
| 9,060,429 B2 * | 6/2015 | Nagaoka | H05K 1/0269 |
| 10,303,014 B2 * | 5/2019 | Oh | H01L 27/3276 |
| 10,548,225 B2 | 1/2020 | Lee et al. | |
| 11,437,441 B2 * | 9/2022 | An | H01L 27/3276 |
| 2007/0052344 A1 * | 3/2007 | Wen | H05K 13/0486 |
| | | | 313/498 |
| 2021/0223597 A1 * | 7/2021 | Nakano | H05K 1/189 |

FOREIGN PATENT DOCUMENTS

| | | |
|---|---|---|
| CN | 110632831 A | 12/2019 |
| JP | 2016-075896 A | 5/2016 |
| KR | 10-1084877 B1 | 11/2011 |
| KR | 10-2018-0025350 A | 3/2018 |

\* cited by examiner

*Primary Examiner* — Sardis F Azongha
(74) *Attorney, Agent, or Firm* — Lewis Roca Rothgerber Christie LLP

(57) ABSTRACT

A display apparatus includes: a display panel comprising a display area and a pad area; a pad portion in the pad area and comprising a plurality of pad terminals; a driving circuit portion in which a plurality of driving terminals are respectively electrically connected to the plurality of pad terminals; and a displacement preventing portion comprising a first displacement preventing portion between the plurality of pad terminals and a second displacement preventing portion between the plurality of driving terminals and coupled to the first displacement preventing portion.

20 Claims, 18 Drawing Sheets

DISPLAY APPARATUS

CROSS-REFERENCE TO RELATED APPLICATION

The present application claims priority to and the benefit of Korean Patent Application No. 10-2020-0092550, filed on Jul. 24, 2020, in the Korean Intellectual Property Office, the disclosure of which is incorporated by reference herein in its entirety.

BACKGROUND

1. Field

Aspects of one or more embodiments relate to a display apparatus.

2. Description of Related Art

Display apparatuses may be used for mobile apparatuses such as smartphones, laptop computers, digital cameras, camcorders, portable information terminals, notebook computers, or tablet personal computers, and for electronic apparatuses such as desktop computers, televisions, outdoor billboards, display apparatuses for exhibition, car dashboards, and head-up displays (HUDs).

In order to apply external power to a display apparatus, a plurality of pad terminals may be patterned at one side of a display panel and a plurality of driving terminals of a driving circuit portion may be electrically connected to a plurality of pad terminals. The pad terminals and the driving terminals may be connected to each other at regular positions without positional errors.

The above information disclosed in this Background section is only for enhancement of understanding of the background and therefore the information discussed in this Background section does not necessarily constitute prior art.

SUMMARY

Aspects of one or more embodiments include a display apparatus in which the connection between a pad terminal and a driving terminal is smooth.

Additional aspects will be set forth in part in the description which follows and, in part, will be more apparent from the description, or may be learned by practice of the presented embodiments of the disclosure.

According to some embodiments of the present disclosure, a display apparatus includes a display panel including a display area and a pad area, a pad portion in the pad area and including a plurality of pad terminals, a driving circuit portion in which a plurality of driving terminals are respectively electrically connected to the pad terminals, and a displacement preventing portion including a first displacement preventing portion between the pad terminals and a second displacement preventing portion between the driving terminals and coupled to the first displacement preventing portion.

According to some embodiments, the first displacement preventing portion and the second displacement preventing portion may be engaged with and coupled to each other.

According to some embodiments, the first displacement preventing portion may include a plurality of insulating dams between the pad terminals, and the second displacement preventing portion may include a dummy driving terminal between the driving terminals and inserted into a first distance between the insulating dams.

According to some embodiments, the pad terminals may be spaced apart from each other on the display panel, an edge of each of the pad terminals may be covered by an insulating layer, and the insulating dams may be on the insulating layer with the first distance therebetween.

According to some embodiments, the insulating dams may extend in a direction in which the pad terminals extend, the first distance may be provided in a direction in which the insulating dams extend, and the dummy driving terminal may extend in a direction in which the driving terminals extend.

According to some embodiments, the first displacement preventing portion may include an insulating dam between the pad terminals, and the second displacement preventing portion may include a second distance provided between the driving terminals, and into which the insulating dam is inserted.

According to some embodiments, the pad terminals may be spaced apart from each other on the display panel, an edge of each of the pad terminals may be covered by an insulating layer, and the insulating dam may be on the insulating layer at a position corresponding to the second distance between the driving terminals.

According to some embodiments, the insulating dam may extend in a direction in which the pad terminals extend, and the second distance between the driving terminals may be provided in a direction in which the driving terminals extend.

According to some embodiments, the first displacement preventing portion may include an organic material.

According to some embodiments, the first displacement preventing portion may include a dummy pad terminal between the pad terminals, the second displacement preventing portion may include a dummy driving terminal between the driving terminals, and the dummy pad terminal and the dummy driving terminal may be located on the same line when the pad portion and the driving circuit portion are overlapped with each other.

According to some embodiments, the pad terminals and the driving terminals each may extend in a first direction, and the dummy pad terminal and the dummy driving terminal may be located on the same line in the first direction.

According to some embodiments, each of the pad terminals may be inclined with respect to the dummy pad terminal, each of the driving terminals may be inclined with respect to the dummy driving terminal, and each pad terminal and each driving terminal may be electrically connected to each other.

According to some embodiments, a first alignment mark may be outside the pad portion, a second alignment mark may be outside the driving circuit portion, and the first alignment mark and the second alignment mark may be overlapped with each other.

According to some embodiments, a conductive particle for electrically connecting the pad terminals and the driving terminals and a conductive film having insulating resin surrounding the conductive particle may be further provided between the pad terminals and the driving terminals.

According to some embodiments of the present disclosure, a display apparatus includes a display panel including a display area and a pad area, a pad portion in the pad area and including a plurality of pad terminals, a driving circuit portion in which a plurality of driving terminals are respectively electrically connected to the pad terminals, and a displacement preventing portion including a first displacement preventing portion between the pad terminals and a second displacement preventing portion between the driving terminals and engaged with and coupled to the first displacement preventing portion.

According to some embodiments, the first displacement preventing portion may include a plurality of insulating dams between the pad terminals, and the second displacement preventing portion may include a dummy driving terminal between the driving terminals and inserted into a first distance between the insulating dams.

According to some embodiments, the first displacement preventing portion may include an insulating dam between the pad terminals, and the second displacement preventing portion may include a second distance provided between the driving terminals, and into which the insulating dam is inserted.

According to some embodiments, a first alignment mark may be outside the pad portion, a second alignment mark may be outside the driving circuit portion, and the first alignment mark and the second alignment mark may be overlapped with each other.

According to some embodiments of the present disclosure, a display apparatus includes a display panel including a display area and a pad area, a pad portion in the pad area and including a plurality of pad terminals, a driving circuit portion in which a plurality of driving terminals respectively electrically connected to the pad terminals, and a displacement preventing portion including a first displacement preventing portion having a dummy pad terminal between the pad terminals and a second displacement preventing portion having a dummy driving terminal between the driving terminals and engaged with and coupled to the first displacement preventing portion, wherein the dummy pad terminal and the dummy driving terminal are located on the same line when the pad portion and the driving circuit portion are overlapped with each other.

According to some embodiments, the pad terminals and the driving terminals each may extend in a first direction, and the dummy pad terminal and the dummy driving terminal may be located on the same line in the first direction.

BRIEF DESCRIPTION OF THE DRAWINGS

The above and other aspects, features, and characteristics of certain embodiments of the disclosure will be more apparent from the following description taken in conjunction with the accompanying drawings, in which:

FIG. 9a is a cross-sectional view of the portion of FIG. 8a;

DETAILED DESCRIPTION

Figure 1:
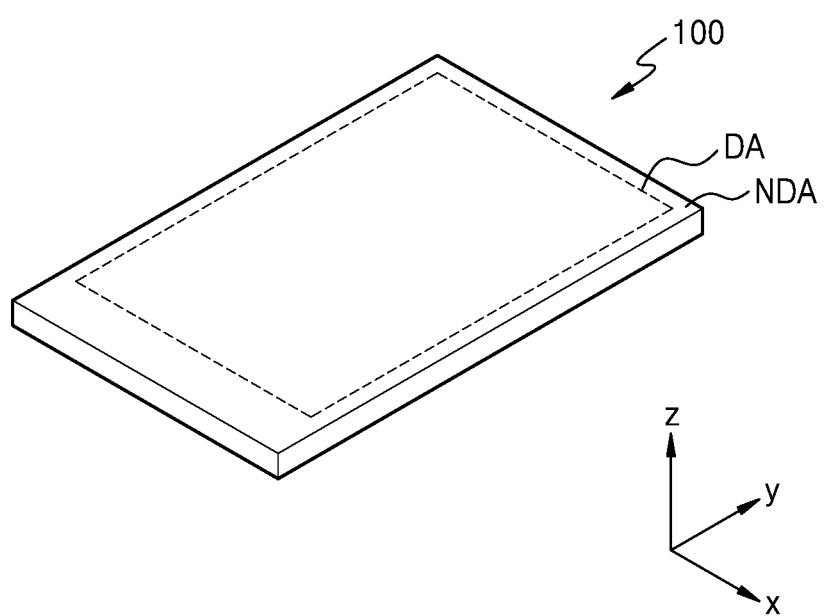
FIG. 1 is a perspective view of a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" may include any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, particular embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

In the embodiments described below, it will be understood that when a component, such as a layer, a film, a region, or a plate, is referred to as being "on" another component, the component can be directly on the other component or intervening components may be present thereon. Sizes of components in the drawings may be exaggerated for convenience of explanation. In other words, because sizes and thicknesses of components in the drawings are arbitrarily illustrated for convenience of explanation, the following embodiments are not limited thereto.

The x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

While such terms as "first," "second," etc., may be used to describe various elements, such elements must not be limited to the above terms. The above terms are used only to distinguish one component from another.

In the following embodiments, an expression used in the singular encompasses the expression of the plural, unless it has a clearly different meaning in the context.

In the following embodiments, it is to be understood that the terms such as "including" and "having" are intended to indicate the existence of the features, or elements described in the present disclosure, and are not intended to preclude the possibility that one or more other features or elements may exist or may be added.

When a certain embodiment may be implemented differently, a specific process order may be performed differently from the described order. For example, two consecutively described processes may be performed substantially at the same time or performed in an order opposite to the described order.

Hereinafter, aspects of some embodiments of the present disclosure will now be described more fully with reference to the accompanying drawings. Like reference numerals in the drawings denote like elements, and thus descriptions thereof will be omitted.

It will be understood that when a layer, region, or component is referred to as being connected to another layer, region, or component, it can be directly or indirectly connected to the other layer, region, or component. That is, for example, intervening layers, regions, or components may be present. For example, it will be understood that when a layer, region, or component is referred to as being electrically connected to another layer, region, or component, it can be directly or indirectly electrically connected to the other layer, region, or component. That is, for example, intervening layers, regions, or components may be present.

FIG. 1 is a schematic perspective view of a display apparatus 100 according to some embodiments.

Referring to the drawing, the display apparatus 100 may include a display area DA and a non-display area NDA extending around (e.g., around a periphery or outside a footprint of) the display area DA. The display apparatus 100 may display images (e.g., static or video images) at the display area DA. Although the display apparatus 100 describes an organic light-emitting display as an example, the display apparatus of the disclosure is not limited thereto. According to some embodiments, the display apparatus 100 may include an inorganic light-emitting display or a quantum dot light emitting display. An emission layer of a display device in the display apparatus 100 may include an organic material, an inorganic material, a quantum dot, an organic material and a quantum dot, or an inorganic material and a quantum dot.

Figure 2A:
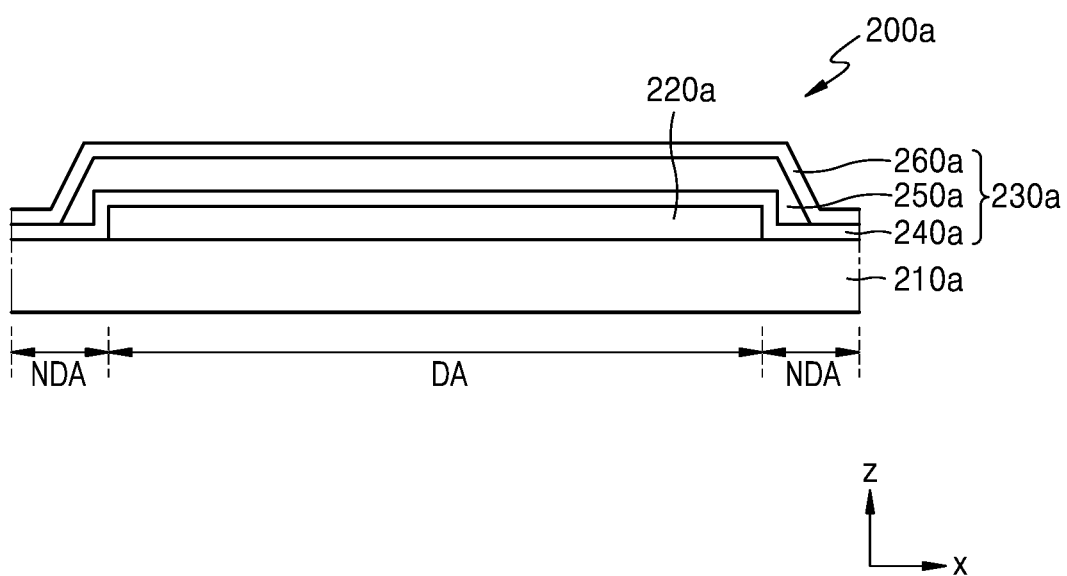
FIGS. 2a and 2b are schematic cross-sectional views of display apparatuses according to some embodiments.
Figure 2B:
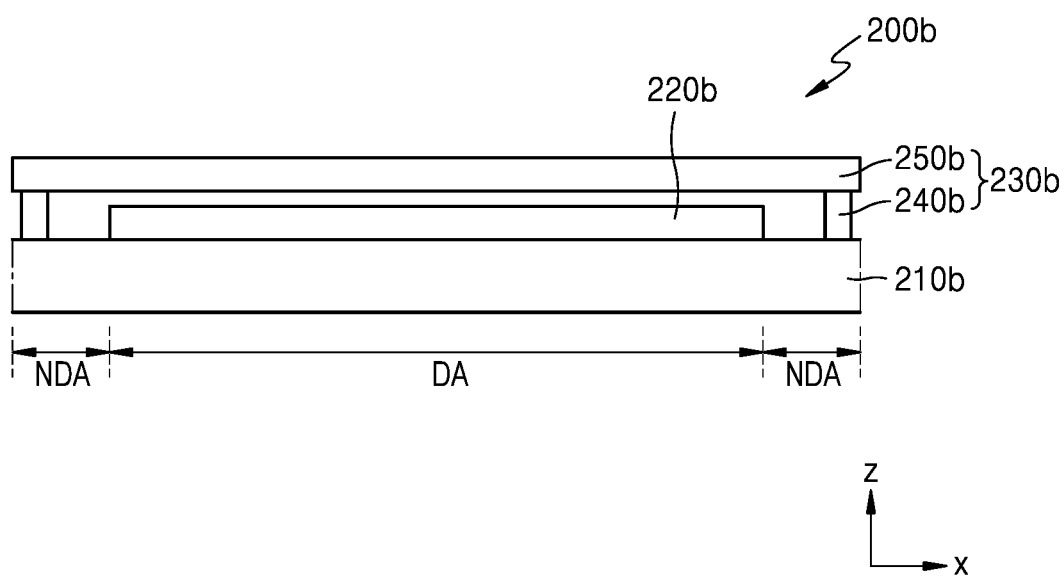

FIGS. 2a and 2B are schematic cross-sectional views of display apparatuses 200a and 200b according to some embodiments.

Referring to FIG. 2a, the display apparatus 200a may include a display element layer 220a on a substrate 210a, and an encapsulation member 230a covering the display element layer 220a.

The substrate 210a may include polymer resin. The substrate 210a may have a single layer or multilayer structure, and for a multilayer structure, may further include an inorganic layer. The substrate 210a may have flexible, rollable, or bendable characteristics.

The display element layer 220a may include a plurality of pixels, and each pixel may include an organic light-emitting diode and a pixel circuit electrically connected to the organic light-emitting diode. The pixel circuit may include a thin film transistor, a storage capacitor, a conductive line connected thereto, and insulating layers.

The encapsulation member 230a may protect the display element layer 220a from foreign materials such as moisture. The encapsulation member 230a may be a thin film encapsulation layer including at least one of first or second inorganic encapsulation layers 240a or 260a, respectively, and at least one organic encapsulation layer 250a.

Although the encapsulation member 230a of FIG. 2a may include the first inorganic encapsulation layer 240a and the second inorganic encapsulation layer 260a, and the organic encapsulation layer 250a interposed therebetween, embodiments according to the present disclosure are not limited thereto. The stacking order of the inorganic encapsulation layers 240a and 260a and the organic encapsulation layer 250a may be variously changed. Although the encapsulation member 230a of FIG. 2a is illustrated to be a thin film encapsulation layer, embodiments according to the present disclosure are not limited thereto.

Referring to FIG. 2b, the display apparatus 200b may include a display element layer 220b on a substrate 210b, and an encapsulation member 230b including a seal portion 240b and an encapsulation plate 250b. The substrate 210b of FIG. 2b may include glass or polymer resin.

The encapsulation plate 250b may be arranged to face the substrate 210b, and the seal portion 240b may be located between the substrate 210b and the encapsulation plate 250b. The seal portion 240b may surround the display area DA. An inner space defined by the substrate 210b, the encapsulation plate 250b, and the seal portion 240b is spatially separated from the outside, and may prevent intrusion of moisture or impurities. The encapsulation plate 250b may include glass, polymer resin, or the like, and the seal portion 240b may use a material such as frit, epoxy, or the like.

Figure 3A:
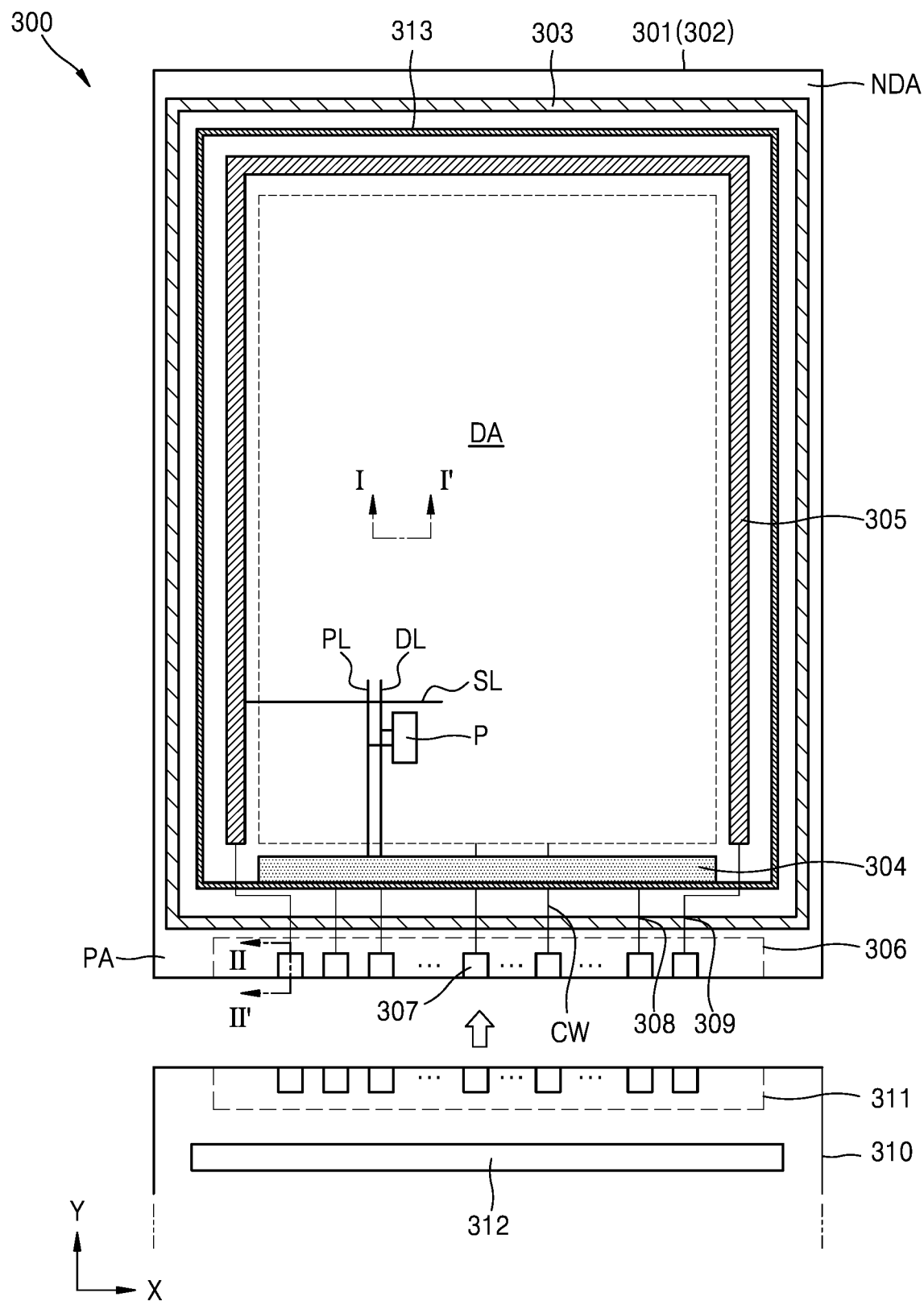
FIGS. 3a and 3b are schematic plan views of a display apparatus according to some embodiments.
Figure 3B:
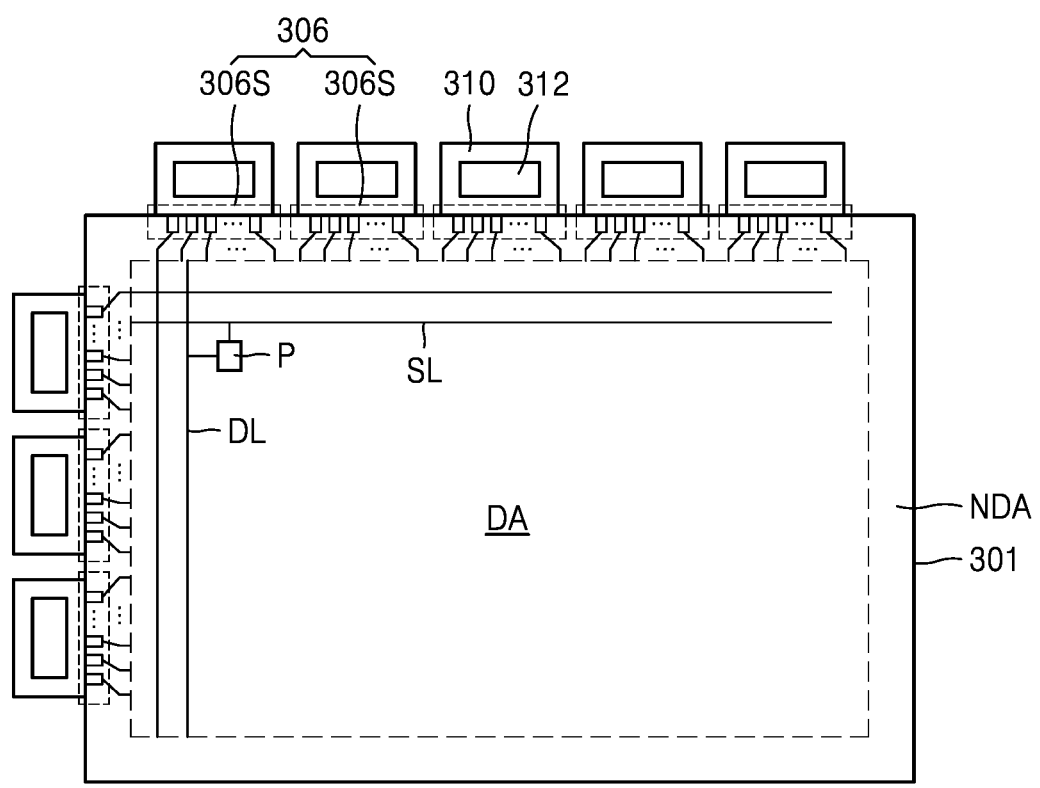

FIGS. 3a and 3b are schematic plan views of a display apparatus 300 according to some embodiments.

Referring to FIG. 3a, the display apparatus 300 may be an apparatus for displaying images. The display apparatus 300 may include a first substrate 301 and a second substrate 302. A seal portion 303 may be located between the first substrate 301 and the second substrate 302. The seal portion 303 may surround the peripheries of the first substrate 301 and the second substrate 302, bonding the first substrate 301 and the second substrate 302.

The display apparatus 300 may include the display area DA and the non-display area NDA extending around the display area DA. The display apparatus 300 may provide or display images by using light emitted from a plurality of pixels located in the display area DA.

The display area DA may include a plurality of pixels P that are connected to a data line DL extending in a Y direction and a scan line SL extending in an X direction intersecting the Y direction. The pixels P may be respectively connected to a plurality of driving voltage lines PL extending in the Y direction.

The pixels P each may include a display device such as an organic light-emitting diode (OLED). All OLEDs included in the pixels P may emit the same color, and the color of each pixel P may be implemented by a color filter or the like located above the OLED. According to some embodiments, each pixel P may emit red, green, blue, or white light through the OLED.

Each pixel P may be electrically connected to a plurality of built-in circuits located in the non-display area NDA. For example, a first power supply wiring 304, a second power supply wiring 305, and a pad portion 306 may be located in the non-display area NDA.

The first power supply wiring 304 may be arranged at one side of the display area DA, for example, in a lower end of the display apparatus 300. The first power supply wiring 304 may be connected to the driving voltage lines PL for transmitting a driving voltage ELVDD to the pixels P.

The second power supply wiring 305 having a loop shape with one side open may partially surround the display area DA. The second power supply wiring 305 may supply a common voltage to an opposite electrode of each pixel P.

The pad portion 306 may include a plurality of pad terminals 307, and may be located at a pad area PA in the first substrate 301. Each of the pad terminals 307 may be connected to a first connection wiring 308 connected to the first power supply wiring 304 or a connection wiring CW extending to the display area DA. Each of the pad terminals 307 may be electrically connected to a driving circuit portion 310. A driving terminal portion 311 of the driving circuit portion 310 may be electrically connected to the pad portion 306.

The driving circuit portion 310 may transmit a signal of a control portion or power to the pad portion 306. The control portion may provide the driving voltage ELVDD and a common voltage ELVSS respectively to the first and second power supply wirings 304 and 305 via the first and second connection wirings 308 and 309.

A data driving circuit 312 may electrically connected to the data line DL. A data signal of the data driving circuit 312 may be provided to each pixel P via the connection wiring CW connected to the pad portion 306 and the data line DL connected to the connection wiring CW. Although FIG. 3a illustrates that the data driving circuit 312 is located in the driving circuit portion 310 according to some embodiments, the data driving circuit 312 may be located on the first substrate 301. For example, the data driving circuit 312 may be located between the pad portion 306 and the first power supply wiring 304.

A dam portion 313 may be located in the non-display area NDA. The dam portion 313 may prevent or reduce instances of an organic material flowing in a direction toward an edge of the first substrate 301 when an organic encapsulation layer of a thin film encapsulation layer is formed, so as to prevent or reduce the formation of an edge tail of the organic encapsulation layer. The dam portion 313 may surround at least part of the display area DA. The dam portion 313 may include a plurality of dams. When the dam portion 313 may include a plurality of dams, the respective dams may be spaced apart from each other. The dam portion 313 may be arranged closer to the display area DA than the seal portion 303.

Although FIG. 3a illustrates that one driving circuit portion 310 is attached to the pad portion 306, as illustrated in FIG. 3b, a plurality of driving circuit portions 310 may be attached to the pad portion 306. The pad portion 306 may be formed along two sides of the first substrate 301. The pad portion 306 may include a plurality of sub-pad portions 306s, and each driving circuit portion 310 may be attached to each of the sub-pad portions 306s.

Figure 4A:
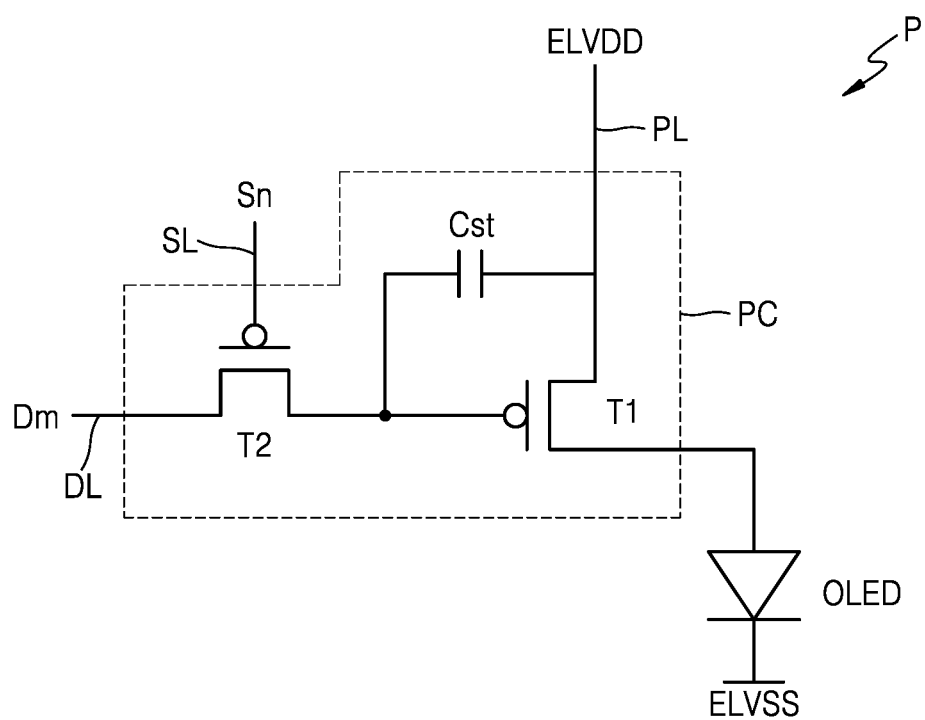
FIGS. 4a and 4b are equivalent circuit diagrams of a pixel of the display apparatus of FIGS. 3a and 3b.
Figure 4B:
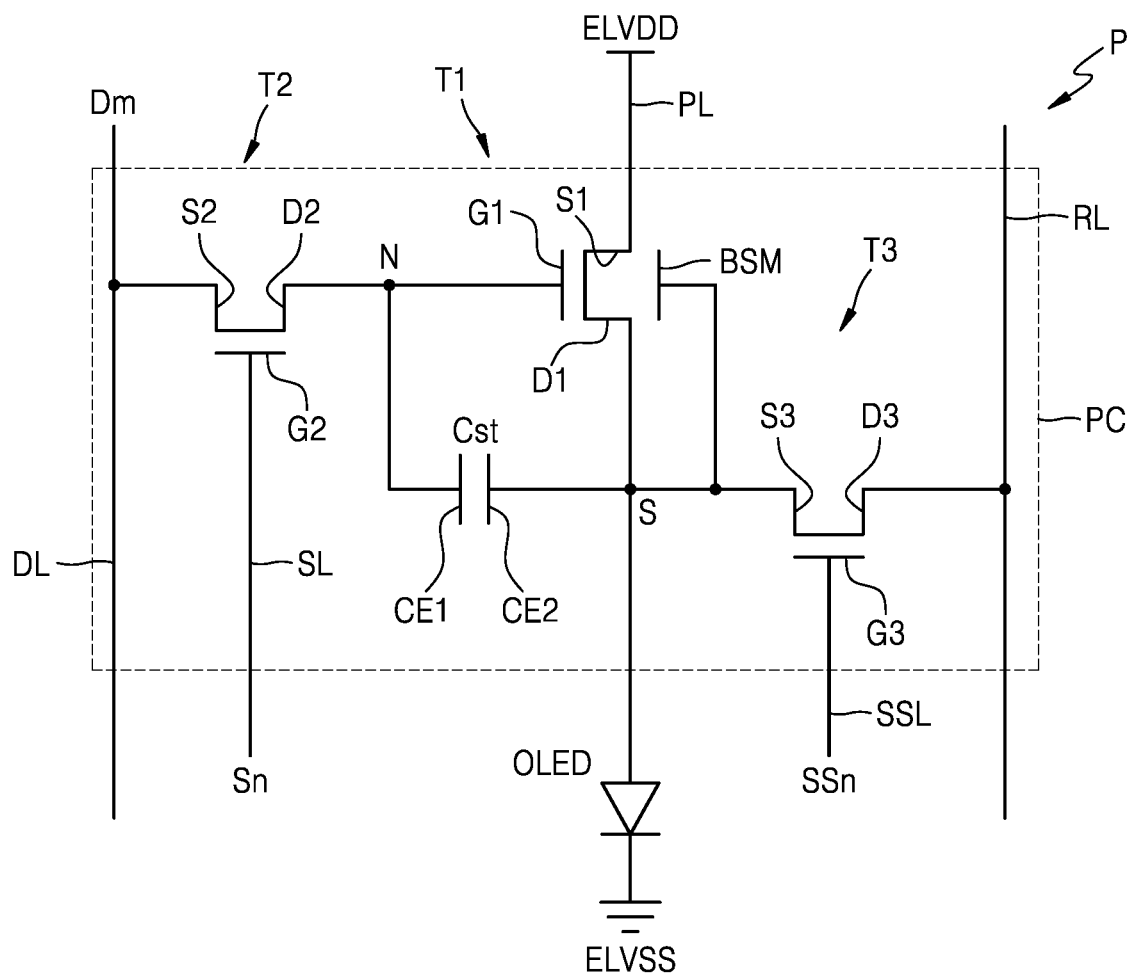

FIGS. 4a and 4b are equivalent circuit diagrams of a pixel according to some embodiments to be provided in the display apparatus 300 of FIGS. 3a and 3b.

Referring to FIG. 4a, each pixel P may include a pixel circuit PC connected to the scan line SL and the data line DL, and the OLED connected to the pixel circuit PC.

The pixel circuit PC may include a driving thin film transistor T1, a switching thin film transistor T2, and a storage capacitor Cst. The switching thin film transistor T2 is connected to the scan line SL and the data line DL, and transmits, in response to a scan signal Sn input through the scan line SL, a data signal Dm input through the data line DL to the driving thin film transistor T1.

The storage capacitor Cst is connected to the switching thin film transistor T2 and the driving voltage lines PL, and the storage capacitor Cst is configured to store a voltage corresponding to a difference between a voltage received from the switching thin film transistor T2 and a first power voltage ELVDD, or a driving voltage, supplied to the driving voltage lines PL.

The driving thin film transistor T1 is connected to the driving voltage lines PL and the storage capacitor Cst, and may control a driving current flowing from the driving voltage lines PL to the OLED in response to a value of a voltage stored in the storage capacitor Cst. The OLED may emit light having a certain brightness according to the driving current.

Although FIG. 4A illustrates a case in which the pixel circuit PC may include two thin film transistors and one storage capacitor, embodiments according to the present disclosure are not limited thereto.

Referring to FIG. 4b, each pixel P may include the OLED and the pixel circuit PC including a plurality of thin film transistors for controlling the OLED. The pixel circuit PC may include the driving thin film transistor T1, the switching thin film transistor T2, a sensing thin film transistor T3, and the storage capacitor Cst.

The scan line SL may be connected to a gate electrode G2 of the switching thin film transistor T2, the data line DL may be connected to a source electrode S2, and a first electrode CE1 of the storage capacitor Cst may be connected to a drain electrode D2. Accordingly, the switching thin film transistor T2, in response to the scan signal Sn from the scan line SL of each pixel P, supplies a data voltage of the data line DL to a first node N.

A gate electrode G1 of the driving thin film transistor T1 may be connected to the first node N, a source electrode S1 may be connected to the driving voltage lines PL for transmitting the driving voltage ELVDD, and a drain electrode D1 may be connected to an anode electrode of the OLED. Accordingly, the driving thin film transistor T1 may adjust a current amount flowing in the OLED according to a source-gate voltage Vgs, that is, a voltage applied between the driving voltage ELVDD and the first node N.

A sensing control line SSL may be connected to a gate electrode G3 of the sensing thin film transistor T3, a source electrode S3 may be connected to a second node S, and a drain electrode D3 may be connected to a reference voltage line RL. According to some embodiments, the sensing thin film transistor T3 may be controlled by the scan line SL instead of the sensing control line SSL.

The sensing thin film transistor T3 may sense the electric potential of a pixel electrode, for example, an anode electrode, of the OLED. The sensing thin film transistor T3, in response to a sensing signal SSn from the sensing control line SSL, may supply a pre-charging voltage from the reference voltage line RL to the second node S, or supply a voltage of the pixel electrode, for example, the anode electrode, of the OLED during a sensing period, to the reference voltage line RL.

The first electrode CE1 of the storage capacitor Cst may be connected to the first node N, and a second electrode CE2 may be connected to the second node S. The storage capacitor Cst charges a difference voltage between the voltages respectively supplied to the first and second nodes N and S and supplies the voltage as a driving voltage of the driving thin film transistor T1. For example, the storage capacitor Cst may charge a difference voltage between a data voltage Dm and a pre-charging voltage Vpre respectively supplied to the first and second nodes N and S.

A bias electrode BSM may be formed corresponding to the driving thin film transistor T1 and connected to the source electrode S3 of the sensing thin film transistor T3. The bias electrode BSM may receive a voltage in association with the electric potential of the source electrode S3 of the sensing thin film transistor T3, and thus the driving thin film transistor T1 may be stabilized. In some embodiments, the bias electrode BSM may be connected to a separate bias wiring, not to the source electrode S3 of the sensing thin film transistor T3.

An opposite electrode, for example, a cathode electrode, of the OLED may receive the common voltage ELVSS. The OLED emits light by receiving the driving current form the driving thin film transistor T1.

Although FIG. 4B illustrates a case in which the signal lines SL, SSL, and DL, the reference voltage line RL, and the driving voltage lines PL are provided for each pixel P, the disclosure is not limited thereto. For example, at least one of the signal lines SL, SSL, or DL, or/and the reference voltage line RL and the driving voltage lines PL may be shared by a neighboring pixel.

The pixel circuit PC is not limited to the number and circuit design of the thin film transistor and the storage capacitor described with reference to FIGS. 4a and 4b, the number and circuit design thereof may be variously changed.

Figure 5:
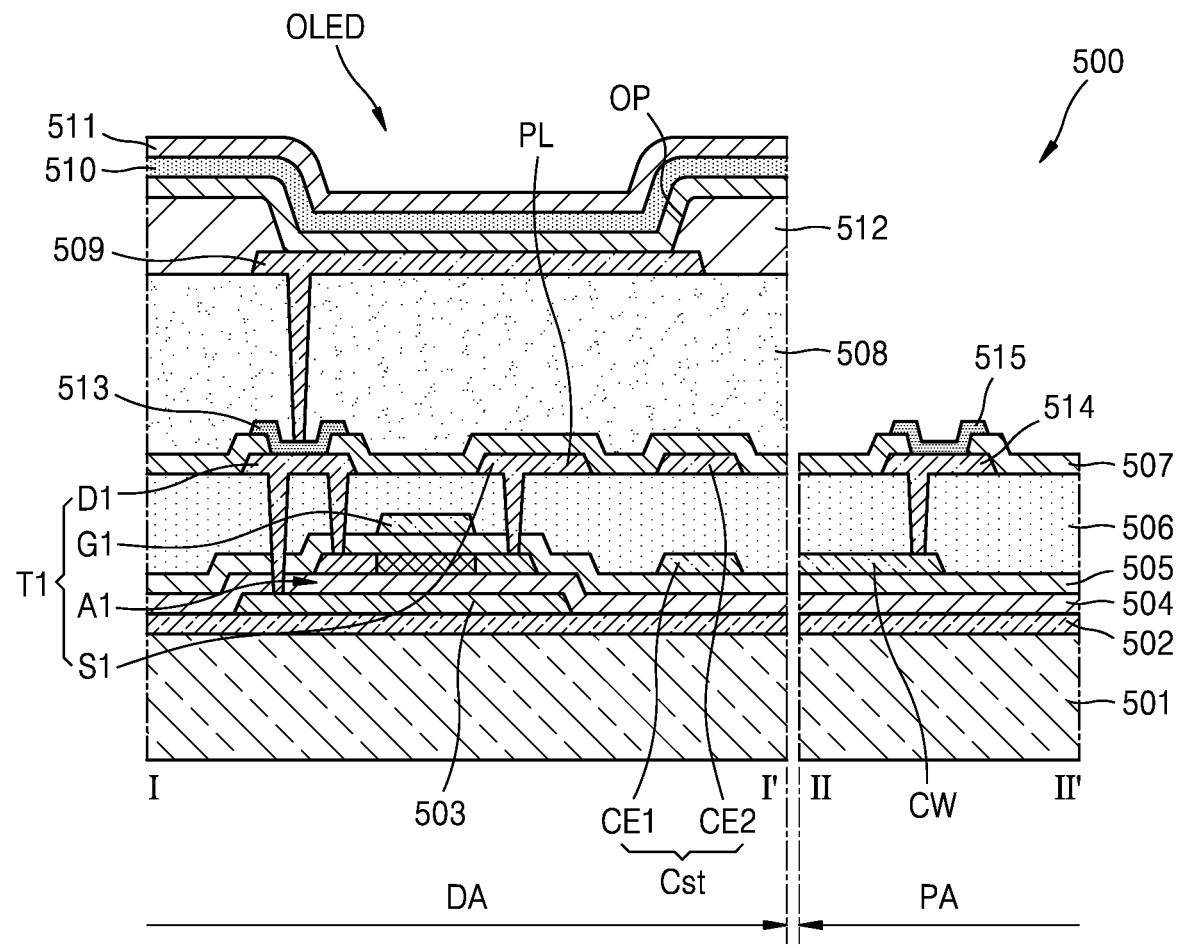
FIG. 5 is a cross-sectional view of a portion of a display apparatus according to some embodiments.

FIG. 5 is a cross-sectional view of a portion of a display panel 500 according to some embodiments.

FIG. 5 may be a cross-sectional view of the display panel 500 obtained by cutting part of the display area DA and part of the pad area PA along lines like the lines I-I' and II-II' of FIG. 3a. The driving thin film transistor T1 and the storage capacitor Cst of the pixel circuit PC of the above-described pixels P are illustrated in the display area of FIG. 5.

Referring to the drawing, the display panel 500 may include a substrate 501. The substrate 501 may include a material such as glass, ceramic, metal, polymer, or the like. A first buffer layer 502 may be arranged on the substrate 501. The first buffer layer 502 may prevent the intrusion of foreign materials or moisture through the substrate 501. For example, the first buffer layer 502 may include an inorganic material such as silicon oxide, silicon nitride, or silicon oxynitride, and may be formed in a single layer or a multilayer.

A bias electrode 503 may be arranged on the first buffer layer 502. The bias electrode 503 may be overlapped with a semiconductor layer A1 of the driving thin film transistor T1. A voltage may be applied to the bias electrode 503. For example, the source electrode S3 of FIG. 4b of the sensing thin film transistor T3 of FIG. 4b may be connected to the bias electrode 503, so that the voltage of the source electrode S3 may be applied thereto. Furthermore, the bias electrode 503 may prevent external light from reaching the semiconductor layer A1. Accordingly, the characteristics of the driving thin film transistor T1 may be stabilized. According to some embodiments, the bias electrode 503 may be omitted.

A second buffer layer 504 may cover the bias electrode 503. The second buffer layer 504 may be formed over the entire are of the substrate 501. The second buffer layer 504 may include an inorganic material such as silicon oxide, silicon nitride, or silicon oxynitride, and may be a single layer or a multilayer.

The semiconductor layer A1 may be located on the second buffer layer 504. The semiconductor layer A1 may include polysilicon, amorphous silicon, oxide semiconductor, an organic semiconductor material, or the like. According to some embodiments, the semiconductor layer A1 may include a channel region overlapping the gate electrode G1, and a source region and a drain region located at both sides of the channel region and including impurities having a higher concentration than that of the channel region. The impurities may include N-type impurities or P-type impurities.

A gate insulating layer 505 may cover the semiconductor layer A1. The gate insulating layer 505 may be an inorganic material layer including silicon oxynitride, silicon oxide, or silicon nitride, and may be a single layer or a multilayer. The gate electrode G1 may be located on the gate insulating layer 505. The gate electrode G1 may include molybdenum (Mo), aluminum (Al), copper (Cu), titanium (Ti), or the like. The gate electrode G1 may be a single layer or a multilayer.

The first electrode CE1 of the storage capacitor Cst may be located on the same layer as the gate electrode G1. The first electrode CE1 may include the same material as that of the gate electrode G1.

An interlayer insulating layer 506 may cover the gate electrode G1 and the first electrode CE1 of the storage capacitor Cst. The interlayer insulating layer 506 may be an inorganic material layer including silicon oxynitride, silicon oxide, or silicon nitride. The interlayer insulating layer 506 may be a single layer or a multilayer.

The source electrode S1, the drain electrode D1, the second electrode CE2 of the storage capacitor Cst, and the driving voltage lines PL may be arranged on the interlayer insulating layer 506. The source electrode S1, the drain electrode D1, the second electrode CE2 of the storage capacitor Cst, and the driving voltage lines PL may include Al, Cu, Ti, or the like, and may be a single layer or a multilayer. According to some embodiments, the source electrode S1, the drain electrode D1, the second electrode CE2 of the storage capacitor Cst, and the driving voltage lines PL may have a multilayer structure of Ti/Al/Ti. The source electrode S1 and the drain electrode D1 may be respectively connected to the source region and the drain region of the semiconductor layer A1 via a contact hole. The source electrode S1 may be connected to the driving voltage lines PL.

The second electrode CE2 of the storage capacitor Cst may overlap the first electrode CE1 with the interlayer insulating layer 506 therebetween, forming capacitance. In this case, the interlayer insulating layer 506 may function as a dielectric layer of the storage capacitor Cst. The thickness of the interlayer insulating layer 506 may be designed according to the value of capacitance of the storage capacitor Cst.

A protection layer 507 may cover the source electrode S1, the drain electrode D1, the second electrode CE2 of the storage capacitor Cst, and the driving voltage lines PL. The protection layer 507 may be an inorganic material layer including silicon oxynitride, silicon oxide, or silicon nitride. The protection layer 507 may protect a conductive layer or wirings located on the interlayer insulating layer 506.

In a display area DA1, a planarization layer 508 may be arranged on the protection layer 507. The planarization layer 508 may include an organic material, and the organic material may include imide-based polymer, general purpose polymer such as polymethylmethacrylate or polystyrene, polymer derivatives having a phenolic group, acryl-based polymer, arylether-based polymer, amide-based polymer, fluorine-based polymer, p-xylene-based polymer, vinyl alcohol-based polymer, and a blend thereof. According to some embodiments, the planarization layer 508 may include polyimide.

When the protection layer 507 having an inorganic material does not exist, a conductive layer or wiring such as the driving voltage lines PL may be oxidized or corroded by reacting with oxygen intruded from the planarization layer 508. However, because some embodiments may include the protection layer 507, a conductive layer or wiring such as the driving voltage lines PL may not directly contact the planarization layer 508.

The OLED may be arranged on the planarization layer 508. The OLED may include a pixel electrode 509, an intermediate layer 510 including an emission layer, and an opposite electrode 511.

The pixel electrode 509 may be electrically connected to the drain electrode D1 via a contact hole penetrating the planarization layer 508. The pixel electrode 509 may be connected to the drain electrode D1 via a conductive protection layer 513. The conductive protection layer 513 may cover the drain electrode D1. The conductive protection layer 513 may be a metal layer for preventing or reducing damage of the drain electrode D1.

The pixel electrode 509 may be a (semi-)transmissive electrode or a reflective electrode. According to some embodiments, the pixel electrode 509 may include a reflection layer including Ag, Mg, Al, Pt, Pd, Au, Ni, Nd, Ir, Cr, and a compound thereof, and a transparent or semi-transparent electrode layer formed on the reflection layer. The transparent or semi-transparent electrode layer may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). According to some embodiments, the pixel electrode 509 may include ITO/Ag/ITO.

A pixel defining film 512 may be located on the planarization layer 508. The pixel defining film 512 may have an opening OP that exposes a part of the pixel electrode 509 and define a light-emitting area by the opening OP. The pixel defining film 512 may include an organic material such as polyimide or hexamethyldisiloxane.

The intermediate layer 510 may include an emission layer. A functional layer such as a hole transterminal layer (HTL), a hole injection layer (HIL), an electron transterminal layer (ETL), an electron injection layer (EIL), or the like may be further selectively arranged below and above the emission layer.

The emission layer may include a low molecular organic material or a polymer organic material.

When the emission layer may include a low molecular organic material, the intermediate layer 510 may stack a hole injection layer, a hole transterminal layer, an emission layer, an electron transterminal layer, an electron injection layer, or the like in a single or composite structure. The low molecular organic material may include various organic materials including copper phthalocyanine (CuPc), N,N'-Di(napthalene-1-yl)-N,N'-diphenyl-benzidine, tris-8-hydroxyquinoline aluminum (Alq3), or the like. These layers may be formed in a vacuum deposition method.

When the emission layer may include a polymer organic material, the intermediate layer 510 may have a structure including a hole transterminal layer and an emission layer. The emission layer may include a polymer material based on poly-phenylene vinylene (PPV), polyfluorene, or the like. The emission layer may be formed by a screen printing method, inkjet printing method, a laser induced thermal imaging (LITI) method, or the like.

The opposite electrode 511 may be a transmissive electrode or a reflective electrode. According to some embodiments, the opposite electrode 511 may be a transparent or semi-transparent electrode, and may be formed as a metal thin film having a low work function and including Li, Ca, LiF/Ca, LiF/Al, Al, Ag, Mg, and a compound thereof. Furthermore, a transparent conductive oxide (TCO) film such as ITO, IZO, ZnO, $In_2O_3$, or the like may be further arranged on the metal thin film. The opposite electrode 511 may extend not only to the display area DA, but also to the non-display area NDA outside the display area DA of FIG. 3a. The opposite electrode 511 may be located on the intermediate layer 510.

In the pad area PA, the connection wiring CW may be located on the gate insulating layer 505. The connection wiring CW may extend to the display area DA. The connection wiring CW may be formed of the same material as that of the gate electrode G1. The interlayer insulating layer 506 may cover the connection wiring CW. A pad terminal 514 may be arranged on the interlayer insulating layer 506. The pad terminal 514 may be electrically connected to the connection wiring CW via a contact hole.

The pad terminal 514 may include Al, Cu, Ti, or the like, and may be a single layer or a multilayer. The protection layer 507 may cover an edge of the pad terminal 514. A conductive protection layer 515 may cover an exposed upper surface of the pad terminal 514. The conductive protection layer 515 may include metal having a low degree of oxidation than the material forming the pad terminal 514, or having superior anti-corrosion properties. According to some embodiments, the top layer of the pad terminal 514 may include Cu, and the conductive protection layer 515 may include Ti.

Figure 6A:
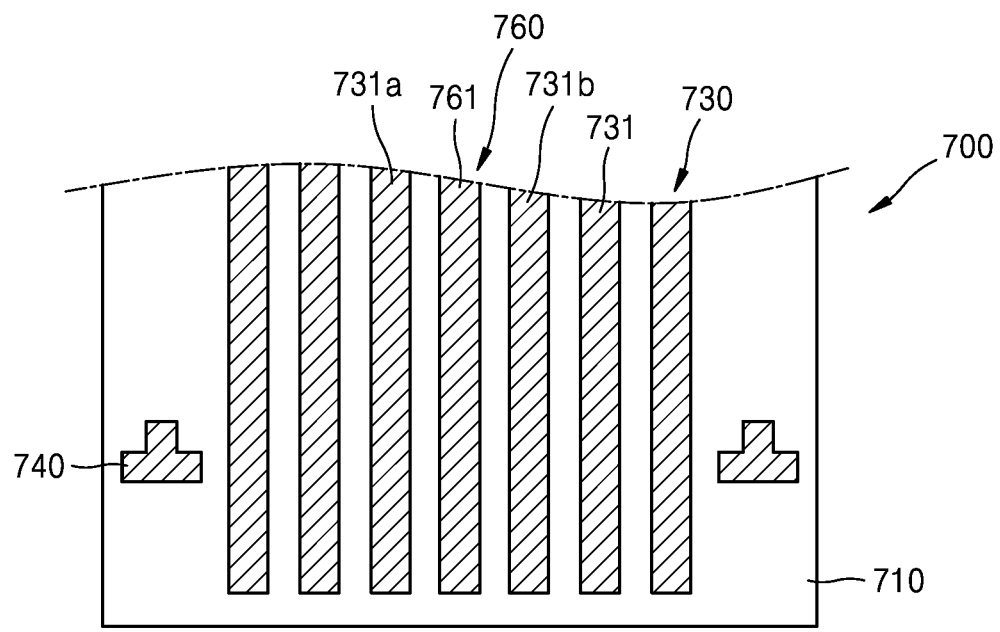
FIG. 6a is an enlarged plan view of a portion where a pad portion and a driving terminal portion according to some embodiments are located.
Figure 6A:
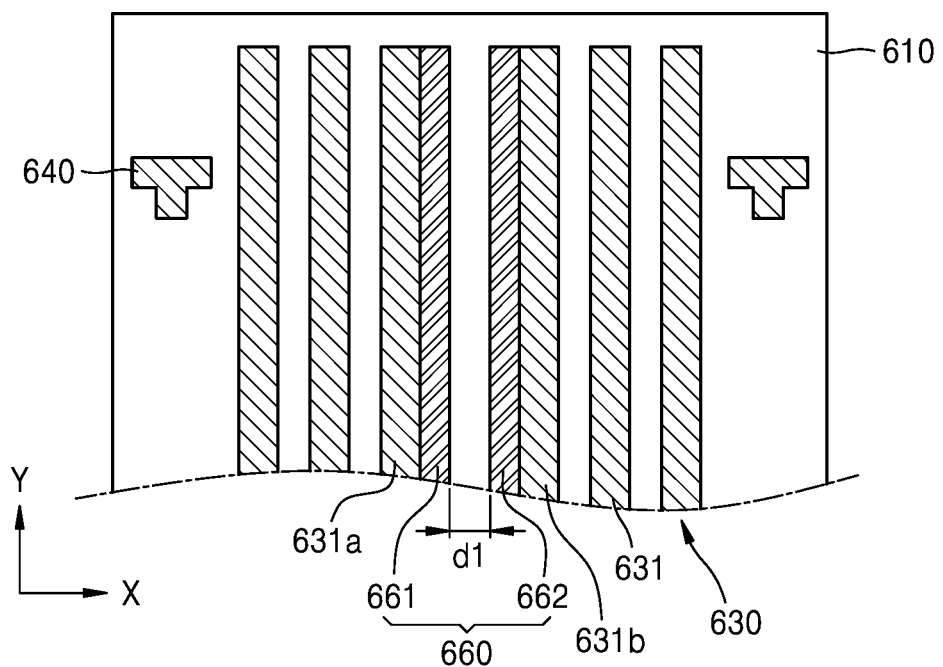
Figure 6B:
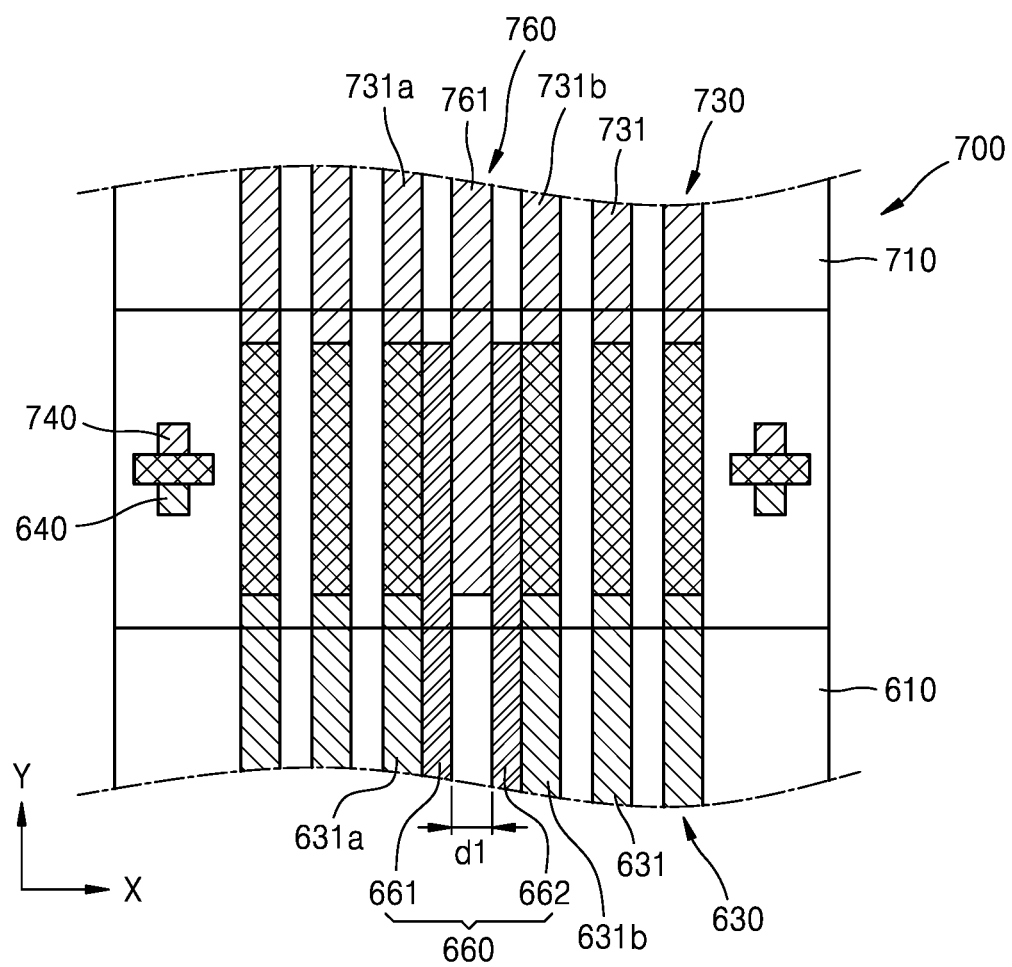
FIG. 6b is an enlarged plan view of the pad portion and the driving terminal portion of FIG. 6a, which are connected to each other according to some embodiments.
Figure 7A:
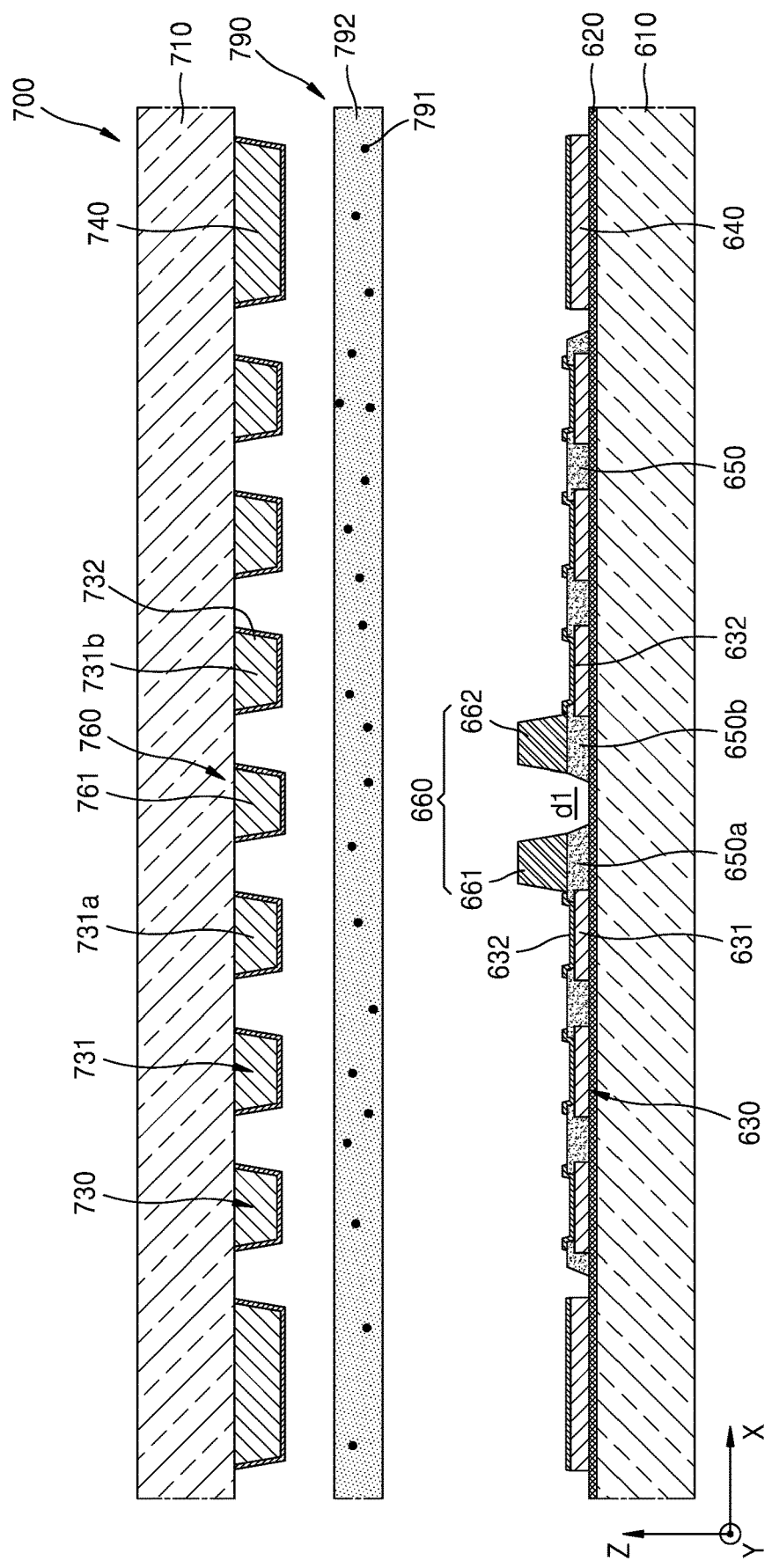
FIG. 7a is a cross-sectional view of the portion of FIG. 6a according to some embodiments.
Figure 7B:
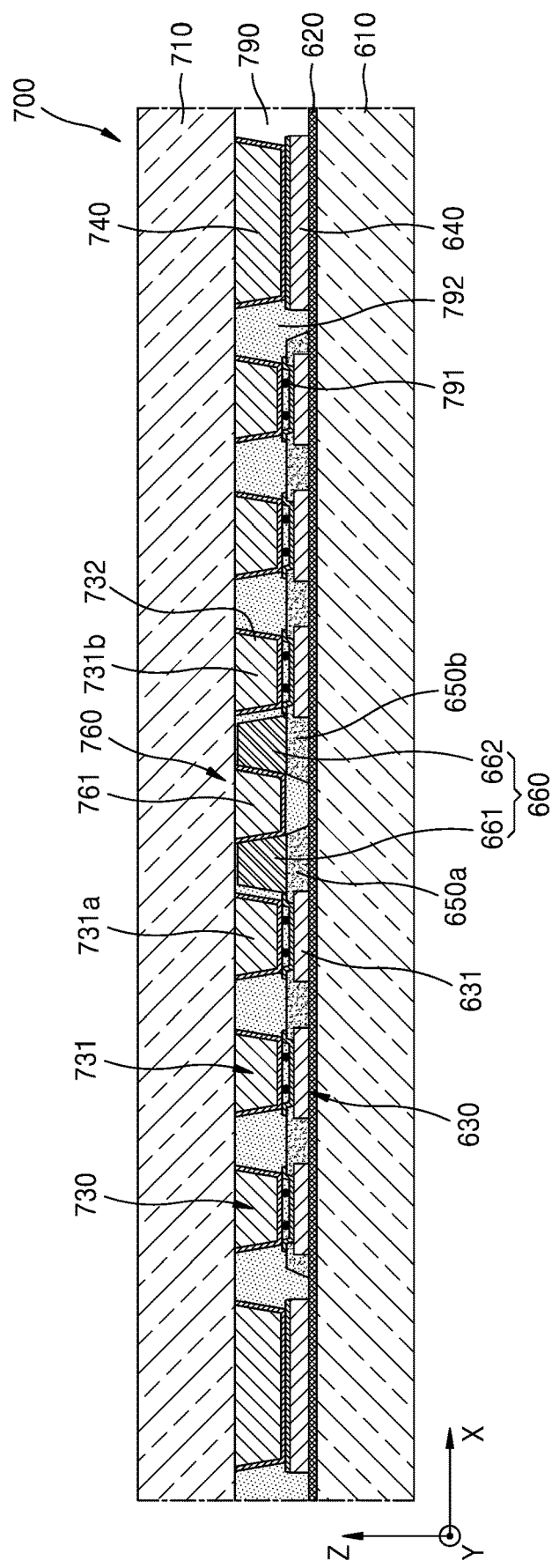
FIG. 7b is a cross-sectional view of the pad portion and the driving terminal portion of FIG. 6b.

FIG. 6a is an enlarged plan view of a portion where a pad portion 630 and a driving terminal portion 730 according to some embodiments are located. FIG. 6b is an enlarged plan view of the pad portion 630 of FIG. 6a and the driving terminal portion 730 are connected to each other. FIG. 7a is a cross-sectional view of FIG. 6a. FIG. 7b is a cross-sectional view of FIG. 6b.

Referring to the drawings, a first insulating layer 620 may be located on a substrate 610. The first insulating layer 620 may include at least one inorganic insulating layers. The pad portion 630 may be located on the first insulating layer 620. The pad portion 630 may include a plurality of pad terminals 631 located in the pad area PA of FIG. 5.

The pad terminals 631 may include at least one conductive layer. The pad terminals 631 may have a single layer or multilayer structure. The pad terminals 631 may be spaced apart from each other by a certain distance in the X direction. The pad terminals 631 may be electrically connected to devices arranged in the display area DA of FIG. 5. Each of the pad terminals 631 may extend in the Y direction. Edges of the pad terminals 631 may be covered by a second insulating layer 650. The second insulating layer 650 may include an inorganic material. According to some embodiments, the second insulating layer 650 may include an organic material. A conductive protection layer 632 may be further located on an exposed upper surface of the pad terminals 631.

A driving circuit portion 700 may be located on the substrate 610. The driving circuit portion 700 may include the above-described data driving circuit 312 of FIG. 3a and a plurality of driving terminal portions 311 connected to the data driving circuit 312. According to some embodiments, the driving circuit portion 700 may be a chip-on-film (COF).

The driving circuit portion 700 may include a flexible film 710. The driving terminal portion 730 may be located on one surface of the flexible film 710. The driving terminal portion 730 may be located on the flexible film 710 facing the pad portion 630. The driving terminal portion 730 may include a plurality of driving terminals 731. The driving terminals 731 may include at least one conductive layer, for example, a copper material. An additional conductive layer 732, for example, a tin layer, may be further formed on an outer surface of the driving terminals 731. The material for the driving terminals 731 is not limited thereto, and the driving terminals 731 may employ any material having relatively superior or high conductivity. The driving terminals 731 may be spaced apart from each other by a certain distance in the X direction. Each of the driving terminals 731 may extend in the Y direction.

Each of the driving terminals 731 may be electrically connected to each of the pad terminals 631. For example, each of the pad terminals 631 and each of the driving terminals 731 may be connected to each other in a Z direction. A conductive portion 790 for electrically connecting the pad terminals 631 to the driving terminals 731 may be further arranged therebetween. According to some embodiments, the pad terminals 631 and the driving terminals 731 may be directly connected to each other.

The conductive portion 790 may be a conducive film in which a current flows in a thickness direction current, and which is insulated in a width direction or a length direction. According to some embodiments, the conductive portion 790 may be an anisotropic conductive film (ACF). The conductive portion 790 may include a conductive particle 791 such as a conductive ball for forming an electrical path between the pad terminals 631 and the driving terminals 731, and an insulation resin 792 for improving connection reliability by fixing the conductive particle 791 at a regular position.

During compression of the pad terminals 631 and the driving terminals 731 by using a compression apparatus such as a hot bar, the pad terminals 631 may be electrically connected to the driving terminals 731 via the conductive particle 791. The insulation resin 792 is distributed to the outside of an area where the pad terminals 631 is connected to the driving terminals 731, so that a pair of the pad terminals 631 and the driving terminals 731 corresponding to in the Z direction and another pair of the pad terminals 631 and the driving terminals 731 adjacent to the pair may be insulated from each other.

An alignment portion may be provided in the pad portion 630 and the driving terminal portion 730 so that the pad portion 630 is connected to the driving terminal portion 730 at a regular position.

A first alignment mark 640 may be located at the outside of the pad portion 630. According to some embodiments, the first alignment mark 640 may be located at both outer sides of the pad portion 630 in the X direction. The first alignment mark 640 may be formed with the same material and in the same process as the pad terminals 631.

A second alignment mark 740 may be located at the outside of the driving terminal portion 730. According to some embodiments, the second alignment mark 740 may be located at both outer sides of the driving terminal portion 730 in the X direction. The second alignment mark 740 may be formed with the same material and in the same process as the driving terminals 731.

When the pad portion 630 is connected to the driving terminal portion 730 in the Z direction, the first alignment mark 640 and the second alignment mark 740 may be at least partially overlapped with each other. A degree of overlapping between the first alignment mark 640 and the second alignment mark 740 is checked by using a vision apparatus, and thus the pad terminals 631 and the driving terminals 731 may be aligned to each other.

When an alignment process is performed by using the first alignment mark 640 and the second alignment mark 740, a vertical misalignment of the pad terminals 631 and the driving terminals 731 with respect to the X axis may be corrected.

Due to heat and pressure applied to the pad portion 630 and the driving terminal portion 730 connected to each other during a thermocompression process, any one terminal of the pad terminals 631 and the driving terminals 731 may be displaced by being pushed to the left or right in the X direction.

In order to prevent or reduce a displacement, a first displacement preventing portion 660 may be arranged between the pad terminals 631, and a second displacement preventing portion 760 may be arranged between the driving terminals 731.

The first displacement preventing portion 660 may be arranged between a plurality of pad terminals 631a and 631b located at the center of the pad portion 630 in the X direction. According to some embodiments, the first displacement preventing portion 660 may be located not only at the center, but also between the pad terminals 631 located at the left and right sides of the pad portion 630.

The first displacement preventing portion 660 may include a plurality of first and second insulating dams 661 and 662, respectively, arranged between the pad terminals 631a and 631b. The first insulating dam 661 and the second insulating dam 662 may be arranged on a plurality of second insulating layers 650a and 650b that are arranged adjacent to each other. A first distance d1 may exist between the first insulating dam 661 and the second insulating dam 662. The first distance d1 may be a space where the pad terminals 631 are not located. The first insulating dam 661 and the second insulating dam 662 may extend in the Y direction in which the pad terminals 631 extend. The first distance d1 may be provided in a direction in which the first insulating dam 661 and the second insulating dam 662 extend.

The insulating dams 661 and 662 may include an organic material. The insulating dams 661 and 662 may include imide-based polymer, general purpose polymer such as polymethylmethacrylate or polystyrene, polymer derivatives having a phenolic group, acryl-based polymer, arylether-based polymer, amide-based polymer, fluorine-based polymer, p-xylene-based polymer, vinyl alcohol-based polymer, polyimide, and a blend thereof. The insulating dams 661 and 662 may have a single layer or multilayer structure. The insulating dams 661 and 662 may be formed with the same material and in the same process as the organic insulating layer, for example, the planarization layer 508, located in the display area DA of FIG. 5. According to some embodiments, the insulating dams 661 and 662 may include an inorganic material.

The second displacement preventing portion 760 may be located between a plurality of driving terminals 731a and 731b located at the center of the driving terminal portion 730 in the X direction. The second displacement preventing portion 760 may be located at a position corresponding to the first displacement preventing portion 660. When the pad portion 630 is connected to the driving terminal portion 730, the first displacement preventing portion 660 and the second displacement preventing portion 760 may be engaged with and coupled to each other.

The second displacement preventing portion 760 may include at least one dummy driving terminal 761 located between the driving terminals 731a and 731b. The dummy driving terminal 761 may have the same shape as each of the driving terminals 731. The dummy driving terminal 761 may extend in the Y direction in which the driving terminals 731 extend.

The dummy driving terminal 761 may be located at a position corresponding to the first distance d1 that is located between the first insulating dam 661 and the second insulating dam 662. When the pad portion 630 is connected to the driving terminal portion 730, the dummy driving terminal 761 may be inserted into the first distance d1 provided between the first insulating dam 661 and the second insulating dam 662. The dummy driving terminal 761 has a trapezoidal cross section, and side walls of the first insulating dam 661 and the second insulating dam 662 around the first distance d1 may have inclined surfaces corresponding to the dummy driving terminal 761.

When the pad portion 630 is connected to the driving terminal portion 730, the first alignment mark 640 and the second alignment mark 740 are overlapped with each other so that the pad portion 630 and the driving terminal portion 730 are aligned to each other.

Furthermore, the dummy driving terminal 761 located at the center of the driving terminal portion 730 may be inserted into the first distance d1 provided at the center of the pad portion 630. As the dummy driving terminal 761 and the insulating dams 661 and 662 forming the first distance d1 are coupled to each other in an engagement manner, during the thermocompression process, the pad terminals 631 and the driving terminals 731 may be prevented from being pushed to the left or right in the X direction.

Figure 8A:
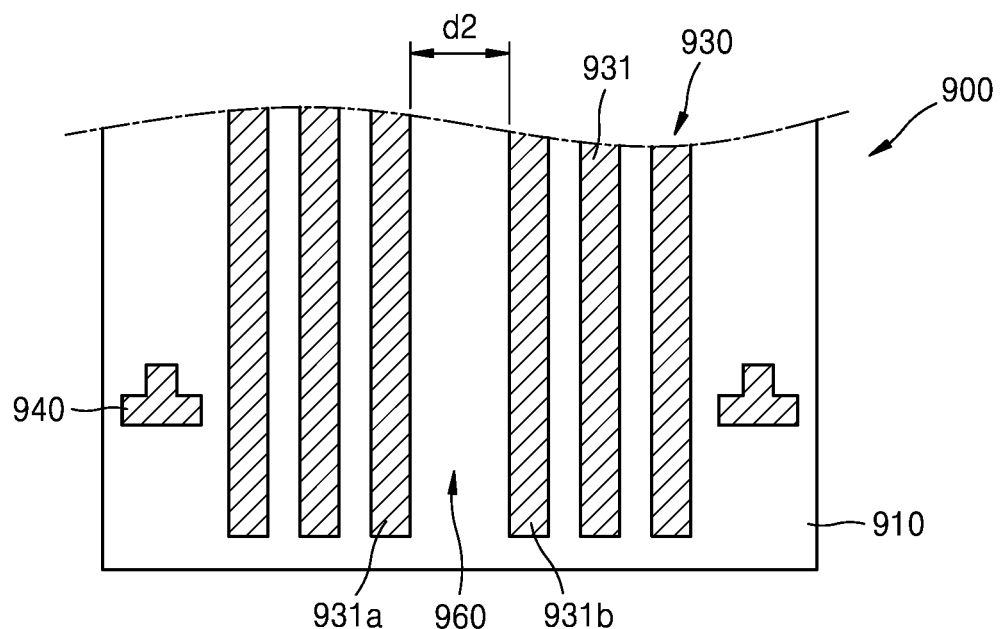
FIG. 8a is an enlarged plan view of a portion where a pad portion and a driving terminal portion according to some embodiments are located.
Figure 8A:
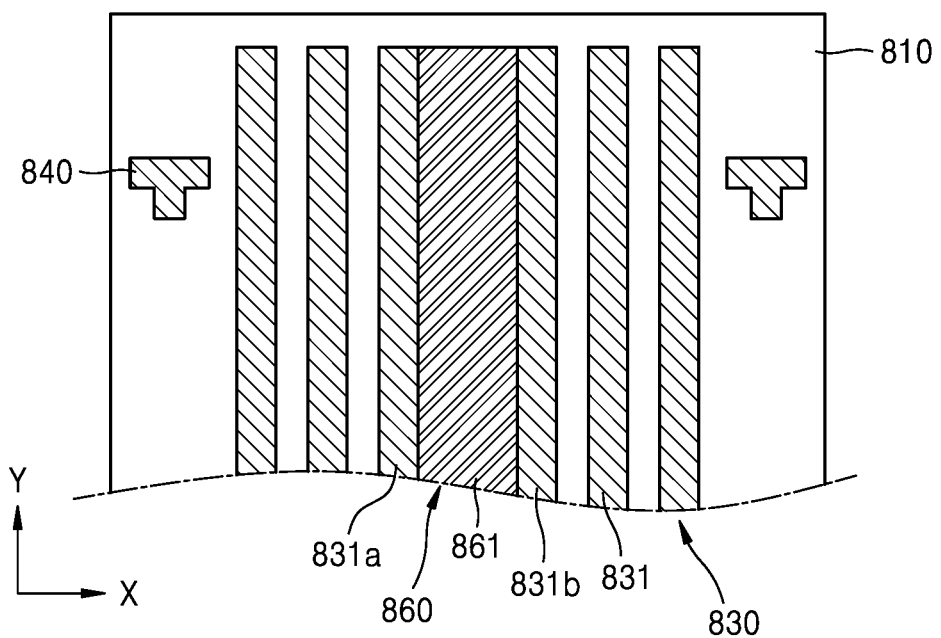
Figure 8B:
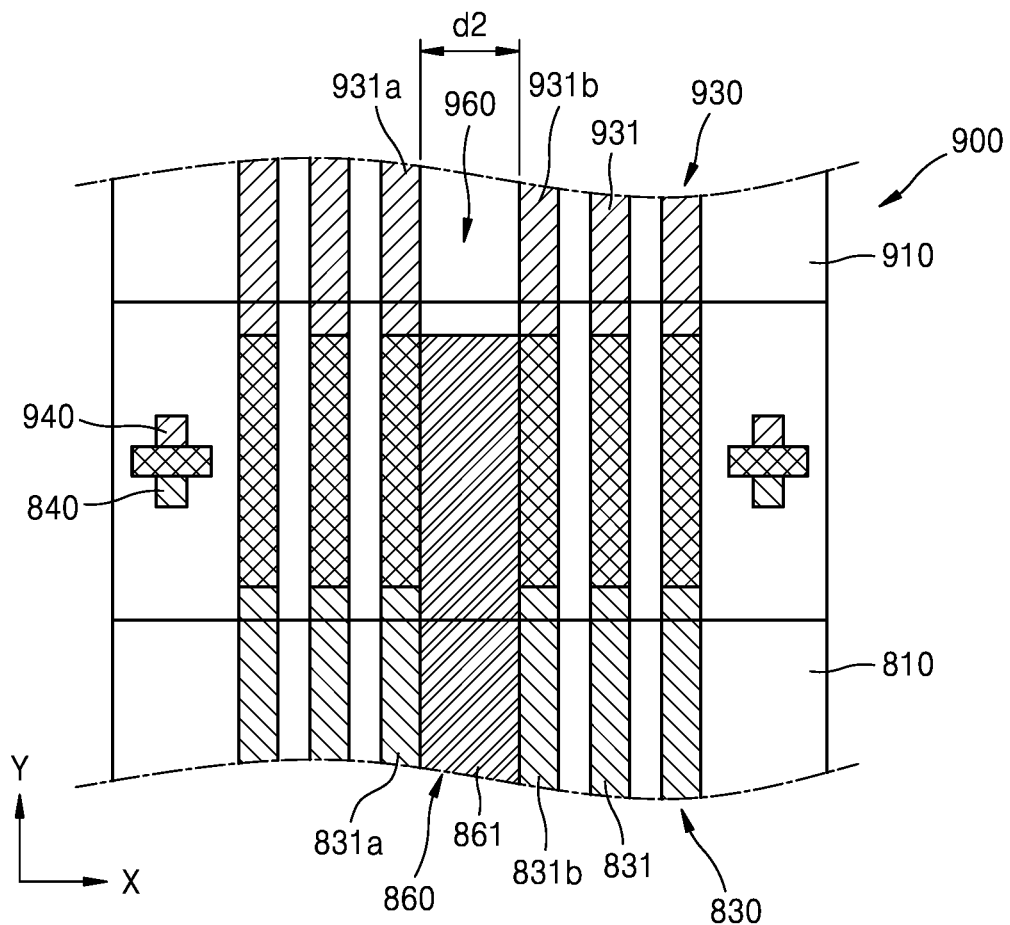
FIG. 8b is an enlarged plan view of the pad portion and the driving terminal portion of FIG. 8a, which are connected to each other according to some embodiments.
Figure 9A:
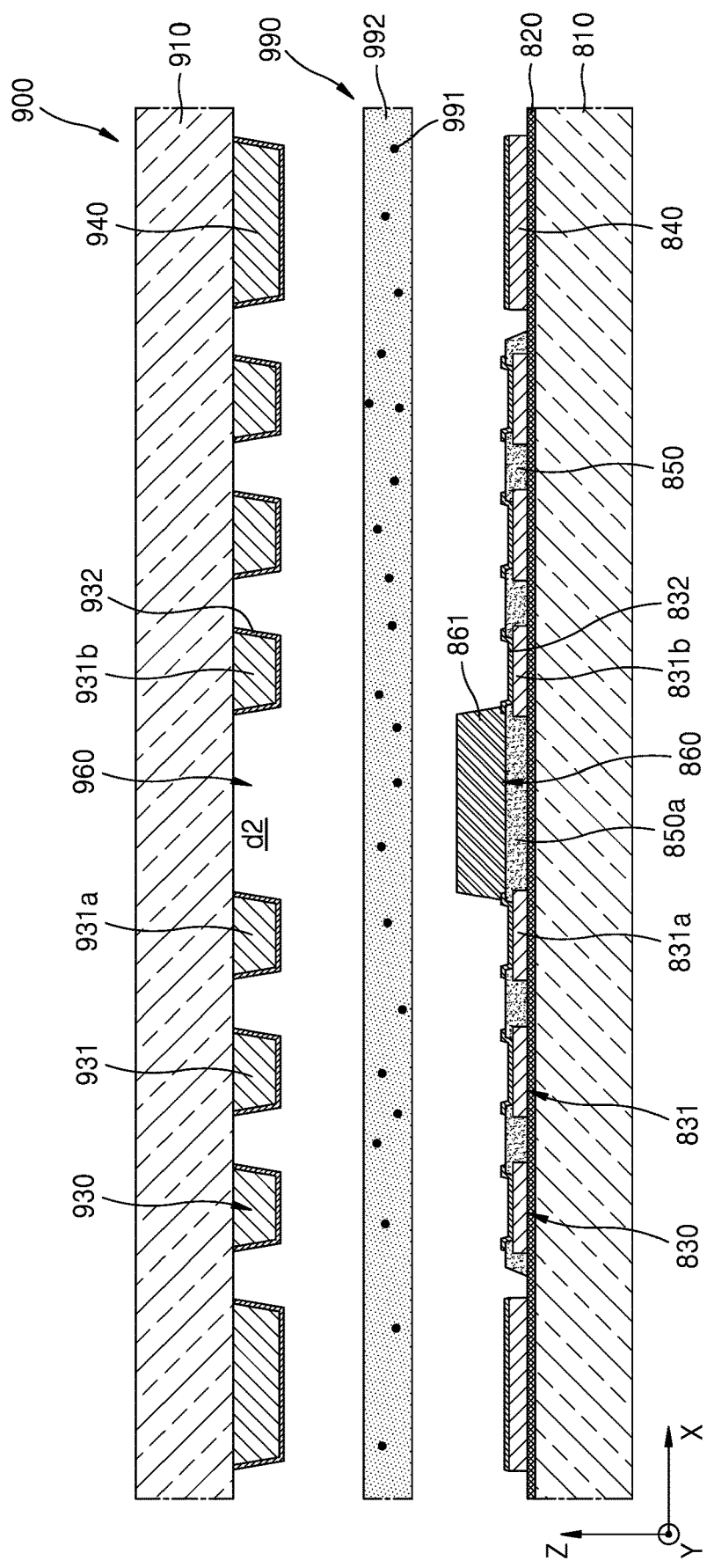
Figure 9B:
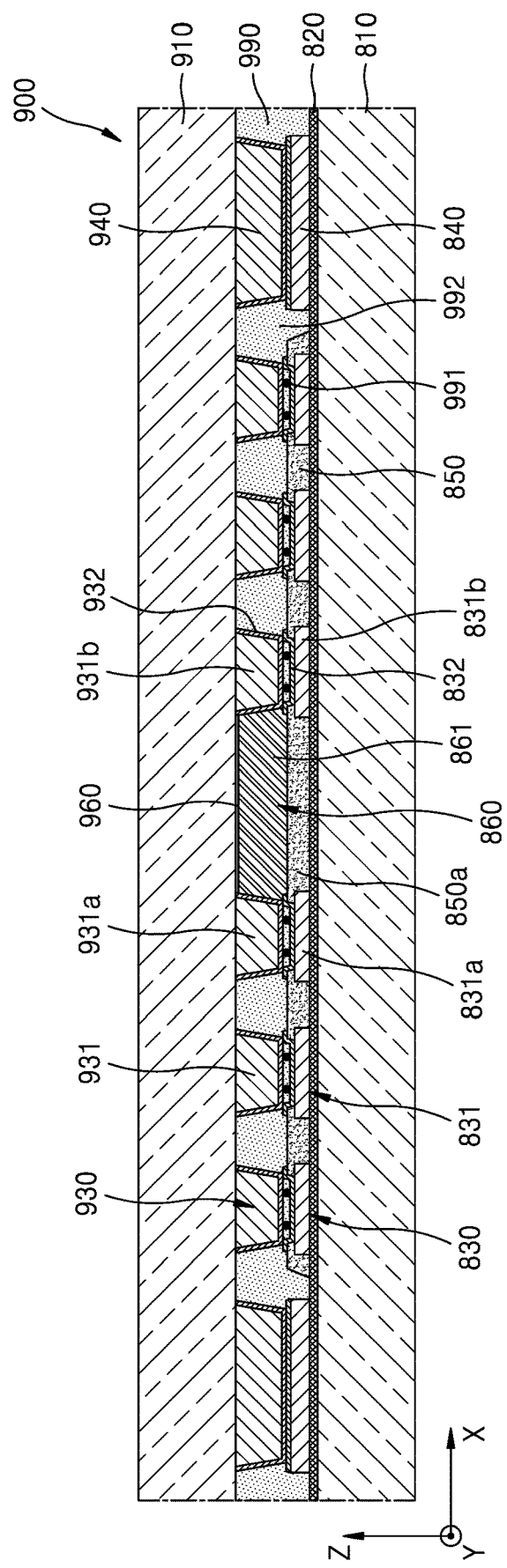
FIG. 9b is a cross-sectional view of the pad portion and the driving terminal portion of FIG. 8b, according to some embodiments.

FIG. 8a is an enlarged plan view of a portion where a pad portion 830 and a driving terminal portion 930 according to some embodiments are located. FIG. 8b is an enlarged plan view of the pad portion 830 and the driving terminal portion 930 of FIG. 8a being connected to each other. FIG. 9a is a cross-sectional view of FIG. 8a. FIG. 9b is a cross-sectional view of FIG. 8b.

Referring to the drawings, a first insulating layer 820 may be arranged on a substrate 810. A pad portion 830 may be arranged on the first insulating layer 820. The pad portion 830 may include a plurality of pad terminals 831.

The pad terminals 831 may be spaced apart from each other by a certain distance in the X direction. Each of the pad terminals 831 may extend in the Y direction. Edges of the pad terminals 831 may be covered by a second insulating layer 850. A conductive protection layer 832 may be arranged on exposed upper surfaces of the pad terminals 831.

A driving circuit portion 900 may be located on the substrate 810. The driving circuit portion 900 may include a flexible film 910. A driving terminal portion 930 may be arranged on one surface of the flexible film 910. The driving terminal portion 930 may be arranged on the flexible film 910 facing the pad portion 830. The driving terminal portion 930 may include a plurality of driving terminals 931. An additional conductive layer 932 may be further formed on outer surfaces of the driving terminals 931. The driving terminals 931 may be spaced apart from each other by a certain distance in the X direction. Each of the driving terminals 931 may extend in the Y direction.

Each of the driving terminals 931 may be electrically connected to each of the pad terminals 831. A conductive portion 990 for electrically connecting the pad terminals 831 and the driving terminals 931 may be further arranged therebetween. According to some embodiments, the conductive portion 990 may be an anisotropic conductive film. The conductive portion 990 may include a conductive particle 991 and an insulation resin 992 surrounding the conductive particle 991.

A first alignment mark 840 may be located at the outside of the pad portion 830. According to some embodiments, the first alignment mark 840 may be arranged at both outer sides of the pad portion 830 in the X direction. A second alignment mark 940 may be arranged at the outside of the driving terminal portion 930. According to some embodiments, the second alignment mark 940 may be arranged at both outer sides of the driving terminal portion 930 in the X direction. When the pad portion 830 is connected to the driving terminal portion 930, the first alignment mark 840 and the second alignment mark 940 may be overlapped with each other.

A first displacement preventing portion 860 is arranged between the pad terminals 831, and a second displacement preventing portion 960 may be arranged between the driving terminals 931.

The first displacement preventing portion 860 may be arranged between a plurality of pad terminals 831a and 832b at the center of the pad portion 830 in the X direction. According to some embodiments, the first displacement preventing portion 860 may be located not only at the center, but also between the pad terminals 831 located at the left and right sides of the pad portion 830.

The first displacement preventing portion 860 may include at least one insulating dam 861 located between a plurality of pad terminals 831a and 831b. An edge of each of the pad terminals 831 may be covered by the second insulating layer 850. The insulating dam 861 may be arranged on a second insulating layer 850a arranged at the center of the pad portion 830. The insulating dam 861 may extend in the Y direction in which the pad terminals 831 extend. The insulating dam 861 may include an organic material. The insulating dam 861 may be formed with the same material and in the same process as the planarization layer 508 arranged in the display area DA of FIG. 5.

The second displacement preventing portion 960 may be arranged between a plurality of driving terminals 931a and 931b arranged at the center of the driving terminal portion 930 in the X direction. The second displacement preventing portion 960 may be located at a position corresponding to the first displacement preventing portion 860. When the pad portion 830 is connected to the driving terminal portion 930, the first displacement preventing portion 860 and the second displacement preventing portion 960 may be engaged with and coupled to each other.

The second displacement preventing portion 960 may have at least one second distance d2 provided between the driving terminals 931a and 931b. The second distance d2 may be a space where the driving terminals 931 are not arranged. The second distance d2 provided between the driving terminals 931a and 931b may extend in the Y direction in which the driving terminals 931 extend.

The insulating dam 861 may be arranged on the second insulating layer 850a at a position corresponding to the second distance d2. When the pad portion 830 is connected to the driving terminal portion 930 in the Z direction, the insulating dam 861 may be inserted into the second distance d2 provided between the driving terminals 931a and 931b. The insulating dam 861 has a trapezoidal cross section, and side walls of the driving terminals 931a and 931b forming the second distance d2 may have inclined surfaces corresponding to the insulating dam 861.

When the pad portion 830 is connected to the driving terminal portion 930, the first alignment mark 840 and the second alignment mark 940 are overlapped with each other so that the pad portion 830 and the driving terminal portion 930 are aligned to each other.

Furthermore, the insulating dam 861 arranged at the center of the pad portion 830 is inserted into the second distance d2 arranged at the center of the driving terminal portion 930. As the insulating dam 861 and the driving terminals 931a and 931b forming the second distance d2 are coupled to each other in an engagement manner, during the thermocompression process, the pad terminals 831 and the driving terminals 931 may be prevented from being pushed to the left or right in the X direction.

Figure 10A:
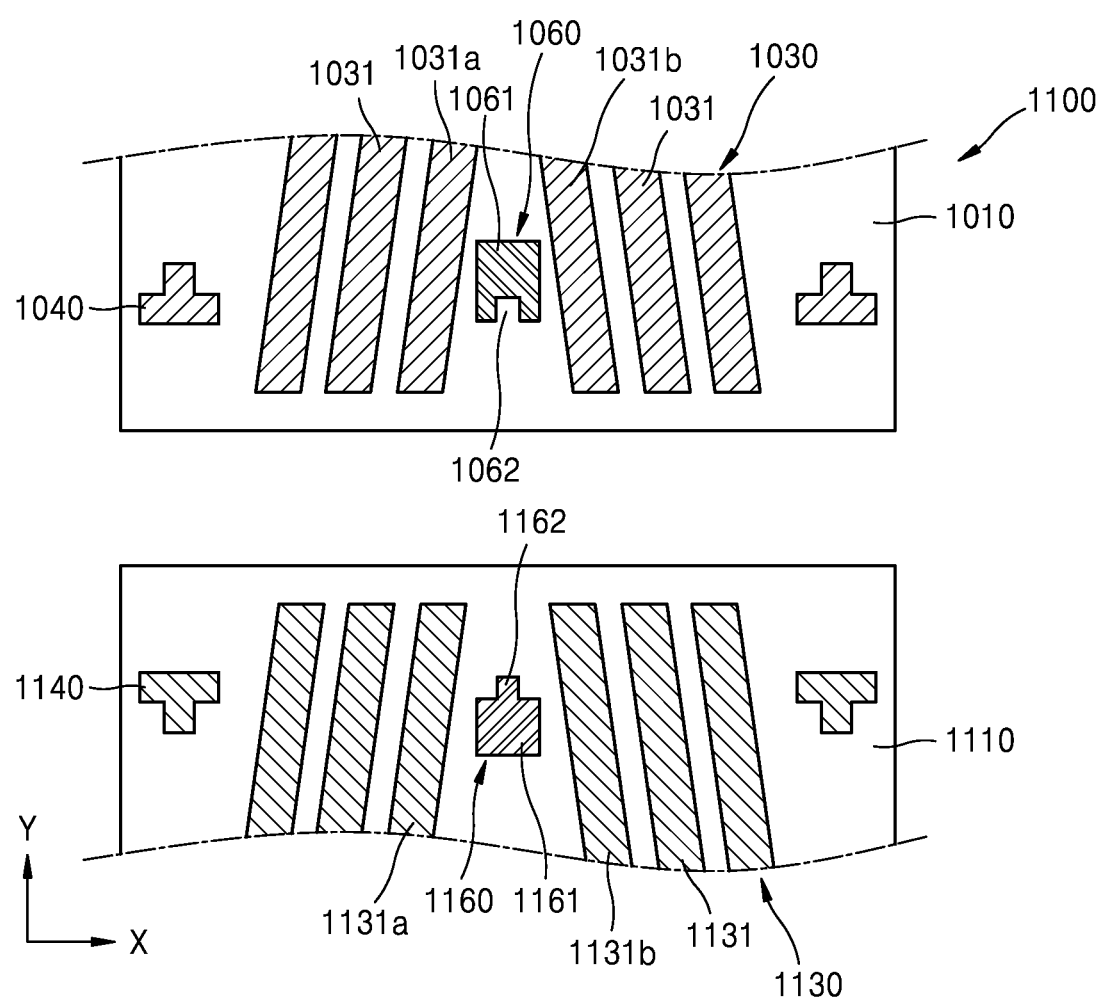
FIG. 10a is an enlarged plan view of a portion where a pad portion and a driving terminal portion according to some embodiments are located.
Figure 10B:
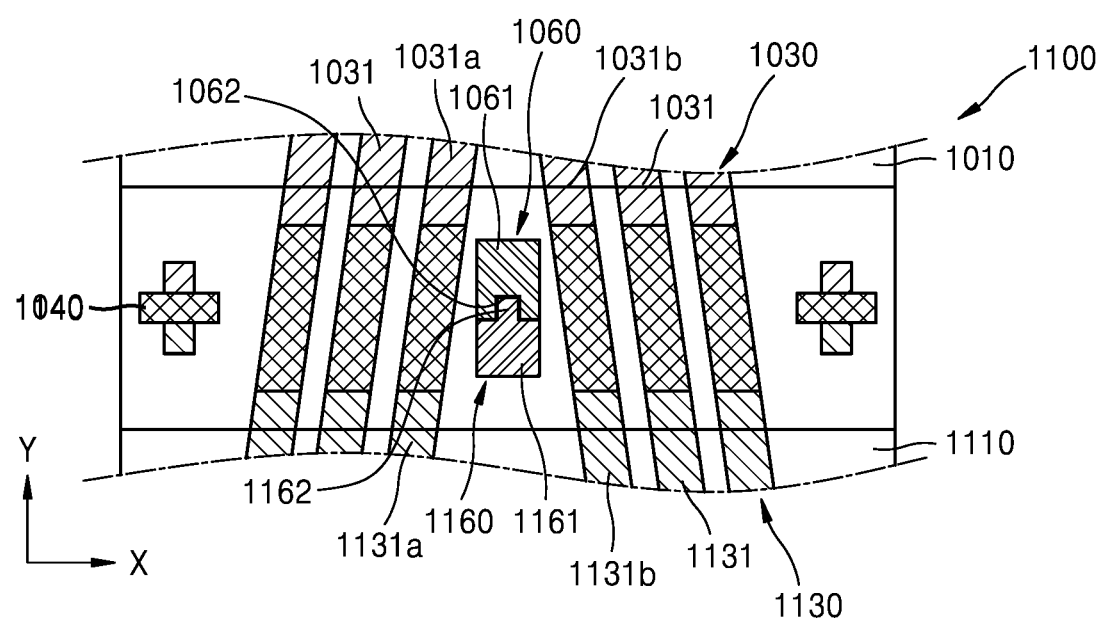
FIG. 10b is an enlarged plan view of the pad portion and the driving terminal portion of FIG. 10a, which are connected to each other according to some embodiments.

FIG. 10a is an enlarged plan view of a portion where a pad portion 1030 and a driving terminal portion 1130 according to some embodiments are located. FIG. 10b is an enlarged plan view of the pad portion 1030 and the driving terminal portion 1130 of FIG. 10a being connected to each other.

Referring to the drawing, the pad portion 1030 may be arranged on a substrate 1010. The pad portion 1030 may include a plurality of pad terminals 1031. The pad terminals 1031 may be spaced apart from each other by a certain distance in the X direction. Each of the pad terminals 1031 may extend in the Y direction. Each of the pad terminals 1031 may be formed to be included by a certain degree.

A driving circuit portion 1100 may be arranged on the substrate 1010. The driving circuit portion 1100 may include a flexible film 1110. The driving terminal portion 1130 may be arranged on one surface of the flexible film 1110. The driving terminal portion 1130 may be arranged on the flexible film 1110 facing the pad portion 1030. The driving terminal portion 1130 may include a plurality of driving terminals 1131. The driving terminals 1131 may be spaced apart from each other by a certain distance in the X direction. Each of the driving terminals 1131 may extend in the Y direction. Each of the driving terminals 1131 may be inclined by a certain degree.

Each of the driving terminals 1131 and each of the pad terminals 1031 are located at positions corresponding to each other, and may be inclined in the same direction. Each of the driving terminals 1131 may be electrically connected to each of the pad terminals 1031. The above-described conductive portion may be located between the pad terminals 1031 and the driving terminals 1131. According to some embodiments, each of the driving terminals 1131 may be directly connected to each of the pad terminals 1031.

A first alignment mark 1040 may be arranged at the outside of the pad portion 1030. According to some embodiments, the first alignment mark 1040 may be arranged at both outer sides of the pad portion 1030 in the X direction. A second alignment mark 1140 may be arranged at the outside of the driving terminal portion 1130. According to some embodiments, the second alignment mark 1140 may be arranged at both outer sides of the driving terminal portion 1130 in the X direction. The first alignment mark 1040 and the second alignment mark 1140 may be located at positions corresponding to each other.

A first displacement preventing portion 1060 may be arranged between the pad terminals 1031, and a second displacement preventing portion 1160 may be arranged between the driving terminals 1131.

For example, the first displacement preventing portion 1060 may be arranged between a plurality of pad terminals 1031a and 1031b arranged at the center of the pad portion 1030 in the X direction. The first displacement preventing portion 1060 may include at least one dummy pad terminal 1061 arranged between the pad terminals 1031a and 1031b.

The dummy pad terminal 1061 may extend in the Y direction in which the pad terminals 1031 extend. The dummy pad terminal 1061 may be arranged in an isolated type. The dummy pad terminal 1061 may have various shapes. For example, the dummy pad terminal 1061 may have a rectangular shape. A groove 1062 having a certain depth may be formed inward in the dummy pad terminal 1061. The dummy pad terminal 1061 may be formed with the same material and in the same process as the pad terminals 1031.

The second displacement preventing portion 1160 may be arranged between a plurality of driving terminals 1131a and 1131b arranged at the center of the driving terminal portion 1130 in the X direction. The second displacement preventing portion 1160 may include at least one dummy driving terminal 1161 arranged between the driving terminals 1131a and 1131b.

The dummy driving terminal 1161 may extend in the Y direction in which the driving terminals 1131 extend. The dummy driving terminal 1161 may have a rectangular shape. A protrusion 1162 having a certain size may protrude from the dummy driving terminal 1161. The dummy driving terminal 1161 may be formed with the same material and in the same process as the driving terminals 1131.

When the pad portion 1030 is connected to the driving terminal portion 1130, the first displacement preventing portion 1060 and the second displacement preventing portion 1160 may be located on the same line in the Y direction. According to some embodiments, the first displacement preventing portion 1060 and the second displacement preventing portion 1160 may be at least partially overlapped with each other. In this state, the protrusion 1162 protruding from the dummy driving terminal 1161 may be located in the groove 1062 formed in the dummy pad terminal 1061.

When alignment is performed by using a vision apparatus, the first alignment mark 1040 and the second alignment mark 1140 are overlapped with each other, and it may be determined whether the pad portion 1030 and the driving terminal portion 1130 are vertically misaligned in the X direction.

Furthermore, as the first displacement preventing portion 1060 and the second displacement preventing portion 1160 are located on the same line in the Y direction at the center where the pad portion 1030 is connected to the driving terminal portion 1130, it may be determined whether, during the thermocompression process, the pad terminals 1031 and the driving terminals 1131 are pushed to the left or right in the X direction.

Each of the pad terminals 1031 may be inclined by a certain degree. For example, the pad terminals 1031 may be inclined toward the dummy pad terminal 1061 from both sides with respect to the dummy pad terminal 1061. Each of the driving terminals 1131 may also be inclined by a certain degree. For example, the driving terminals 1131 may be inclined toward the dummy driving terminal 1161 from both sides with respect to the dummy driving terminal 1161. Each of the pad terminals 1031 and each of the driving terminals 1131 may be arranged at positions corresponding to each other.

The alignment of the driving terminals 1131 to the pad terminals 1031 may be difficult because the flexible film 1110 is stretched due to the heat applied during the thermocompression process. When the pad terminals 1031 and the driving terminals 1131 are arranged to be inclined, even when any one of the pad terminals 1031 and the driving terminals 1131 is deviated from a regular position, the alignment between the pad terminals 1031 and the driving terminals 1131 may be further facilitated because the pad terminals 1031 and the driving terminals 1131 are connected to each other vertically at various angles compared with the connection in one direction.

In the display apparatus according to some embodiments, as the pad terminal and the driving terminal are connected to each other at a regular position without a positional error, the reliability of electrical connection between the pad terminal and the driving terminal may be improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
   a display panel comprising a display area and a pad area;
   a pad portion in the pad area and comprising a plurality of pad terminals;
   a driving circuit portion having a plurality of driving terminals respectively electrically connected to the plurality of pad terminals; and
   a displacement preventing portion comprising a first displacement preventing portion between the plurality of pad terminals and a second displacement preventing portion between the plurality of driving terminals and coupled to the first displacement preventing portion.

2. The display apparatus of claim 1, wherein the first displacement preventing portion and the second displacement preventing portion are engaged with and coupled to each other.

3. The display apparatus of claim 2, wherein the first displacement preventing portion comprises a plurality of insulating dams between the plurality of pad terminals, and
   the second displacement preventing portion comprises a dummy driving terminal between the plurality of driving terminals and inserted into a first distance between the plurality of insulating dams.

4. The display apparatus of claim 3, wherein the plurality of pad terminals are spaced apart from each other on the display panel,
   an edge of each of the plurality of pad terminals is covered by an insulating layer, and
   the plurality of insulating dams are on the insulating layer with the first distance therebetween.

5. The display apparatus of claim 3, wherein the plurality of insulating dams extend in a direction in which the plurality of pad terminals extend,
   the first distance extends in a direction in which the plurality of insulating dams extend, and
   the dummy driving terminal extends in a direction in which the plurality of driving terminals extend.

6. The display apparatus of claim 2, wherein the first displacement preventing portion comprises an insulating dam between the plurality of pad terminals, and
   the second displacement preventing portion comprises a second distance between the plurality of driving terminals and into which the insulating dam is inserted.

7. The display apparatus of claim 6, wherein the plurality of pad terminals are spaced apart from each other on the display panel,
   an edge of each of the plurality of pad terminals is covered by an insulating layer, and
   the insulating dam is on the insulating layer at a position corresponding to the second distance between the plurality of driving terminals.

8. The display apparatus of claim 6, wherein the insulating dam extends in a direction in which the plurality of pad terminals extend, and
   the second distance between the plurality of driving terminals extends in a direction in which the plurality of driving terminals extend.

9. The display apparatus of claim 2, wherein the first displacement preventing portion comprises an organic material.

10. The display apparatus of claim 1, wherein the first displacement preventing portion comprises a dummy pad terminal between the plurality of pad terminals,
    the second displacement preventing portion comprises a dummy driving terminal between the plurality of driving terminals, and
    the dummy pad terminal and the dummy driving terminal are on a same line when the pad portion and the driving circuit portion are overlapped with each other.

11. The display apparatus of claim 10, wherein the plurality of pad terminals and the plurality of driving terminals each extend in a first direction, and
    the dummy pad terminal and the dummy driving terminal are located on the same line in the first direction.

12. The display apparatus of claim 10, wherein each of the plurality of pad terminals is inclined with respect to the dummy pad terminal,
    each of the plurality of driving terminals are inclined with respect to the dummy driving terminal, and
    each pad terminal and each driving terminal are electrically connected to each other.

13. The display apparatus of claim 1, wherein a first alignment mark is outside the pad portion,
    a second alignment mark is outside the driving circuit portion, and
    the first alignment mark and the second alignment mark are overlapped with each other.

14. The display apparatus of claim 1, wherein a conductive particle for electrically connecting the plurality of pad terminals and the plurality of driving terminals and a conductive film having insulating resin surrounding the conductive particle are further provided between the plurality of pad terminals and the plurality of driving terminals.

15. A display apparatus comprising:
    a display panel comprising a display area and a pad area;
    a pad portion in the pad area and comprising a plurality of pad terminals;
    a driving circuit portion in which a plurality of driving terminals respectively electrically connected to the plurality of pad terminals; and
    a displacement preventing portion comprising a first displacement preventing portion between the plurality of pad terminals and a second displacement preventing portion between the plurality of driving terminals and engaged with and coupled to the first displacement preventing portion.

16. The display apparatus of claim 15, wherein the first displacement preventing portion comprises a plurality of insulating dams between the plurality of pad terminals, and
    the second displacement preventing portion comprises a dummy driving terminal between the plurality of driving terminals and inserted into a first distance between the plurality of insulating dams.

17. The display apparatus of claim 15, wherein the first displacement preventing portion comprises an insulating dam between the plurality of pad terminals, and the second displacement preventing portion comprises a second distance provided between the plurality of driving terminals, and into which the insulating dam is inserted.

18. The display apparatus of claim 15, wherein a first alignment mark is outside the pad portion, a second alignment mark is outside the driving circuit portion, and the first alignment mark and the second alignment mark are overlapped with each other.

19. A display apparatus comprising:

a display panel comprising a display area and a pad area;

a pad portion in the pad area and comprising a plurality of pad terminals;

a driving circuit portion in which a plurality of driving terminals are respectively electrically connected to the plurality of pad terminals; and a displacement preventing portion comprising a first displacement preventing portion having a dummy pad terminal between the plurality of pad terminals and a second displacement preventing portion having a dummy driving terminal between the plurality of driving terminals and engaged with and coupled to the first displacement preventing portion, wherein the dummy pad terminal and the dummy driving terminal are on a same line when the pad portion and the driving circuit portion are overlapped with each other.

20. The display apparatus of claim 19, wherein the plurality of pad terminals and the plurality of driving terminals each extend in a first direction, and the dummy pad terminal and the dummy driving terminal are on the same line in the first direction.

\* \* \* \* \*